United States Patent
Miyao et al.

(10) Patent No.: US 9,193,850 B2
(45) Date of Patent: Nov. 24, 2015

(54) NANOCOMPOSITE, PROCESS FOR PREPARING THE SAME, AND SURFACE EMITTING DEVICE

(75) Inventors: Hiroshi Miyao, Yokohama (JP); Tadao Yagi, Yokohama (JP); Mikio Konno, Sendai (JP); Daisuke Nagao, Miyagi-ken (JP); Keisuke Abe, Miyagi-ken (JP)

(73) Assignee: SAMSUNG ELECTRONICS CO., LTD. (KR)

( * ) Notice: Subject to any disclaimer, the term of this patent is extended or adjusted under 35 U.S.C. 154(b) by 185 days.

(21) Appl. No.: 13/570,862

(22) Filed: Aug. 9, 2012

(65) Prior Publication Data

US 2013/0037786 A1 Feb. 14, 2013

(30) Foreign Application Priority Data

Aug. 11, 2011 (JP) .................................. 2011-176358
Jun. 7, 2012 (KR) ........................ 10-2012-0061078

(51) Int. Cl.
| | |
|---|---|
| C08L 79/08 | (2006.01) |
| H01L 51/54 | (2006.01) |
| C08K 9/04 | (2006.01) |
| B82Y 30/00 | (2011.01) |
| B82Y 20/00 | (2011.01) |
| H01L 51/52 | (2006.01) |

(52) U.S. Cl.
CPC . *C08K 9/04* (2013.01); *B82Y 20/00* (2013.01); *B82Y 30/00* (2013.01); *G02B 2207/101* (2013.01); *H01L 51/5275* (2013.01); *H01L 2251/5369* (2013.01)

(58) Field of Classification Search
None
See application file for complete search history.

(56) References Cited

U.S. PATENT DOCUMENTS

| | | | |
|---|---|---|---|
| 6,150,456 A | 11/2000 | Lee et al. | |
| 2005/0025976 A1 | 2/2005 | Faris | |
| 2008/0157665 A1* | 7/2008 | Wu et al. | 313/506 |
| 2010/0135937 A1* | 6/2010 | O'Brien et al. | 424/59 |
| 2011/0059264 A1* | 3/2011 | Park et al. | 427/510 |
| 2012/0088845 A1* | 4/2012 | Gonen Williams et al. | 514/772.4 |

FOREIGN PATENT DOCUMENTS

| | | |
|---|---|---|
| JP | 1993051541 A | 3/1993 |
| JP | 11-106650 A | 4/1999 |
| JP | 2001164136 A | 6/2001 |
| JP | 2001348477 A | 12/2001 |
| JP | 2005171208 A | 6/2005 |
| JP | 2009298955 A | 12/2009 |
| JP | 2010222228 A | 10/2010 |

(Continued)

OTHER PUBLICATIONS

J. Lee et al, Effect of Poly(amic acid)-treated BaTiO3 on the Dielectric and Mechanical Properties of BaTiO3/Polyimide Composites, Macromolecular Research, vol. 18, No. 2, 2010, pp. 200-203.

(Continued)

*Primary Examiner* — J. L. Yang
(74) *Attorney, Agent, or Firm* — Cantor Colburn LLP

(57) ABSTRACT

A nanocomposite including: a matrix including a polyimide; and surface-modified inorganic oxide particles disposed in the matrix, wherein a surface of a particle of the surface-modified inorganic oxide particles is modified with an imide functional group.

17 Claims, 6 Drawing Sheets

(56) References Cited

FOREIGN PATENT DOCUMENTS

| | | |
|---|---|---|
| KR | 1020090074997 A | 7/2009 |
| KR | 1020100124624 A | 11/2010 |

OTHER PUBLICATIONS

Japanese Office Action for Japanese Patent Application No. 2011-176358 dated Jun. 30, 2015 with English Translation.

* cited by examiner

NANOCOMPOSITE, PROCESS FOR PREPARING THE SAME, AND SURFACE EMITTING DEVICE

CROSS-REFERENCE TO RELATED APPLICATIONS

This application claims priority to and the benefit of Korean Patent Application No. 10-2012-0061078, filed on Jun. 7, 2012, and Japanese Patent Application No. 2011-176358, filed on Aug. 11, 2011, and all the benefits accruing therefrom under 35 U.S.C. §119, the contents of which are incorporated herein in their entirety by reference.

BACKGROUND

1. Field

The present disclosure relates to a nanocomposite, a process for preparing the same, and a surface emitting device using the nanocomposite.

2. Description of the Related Art

Organic resins have been widely used in various fields due to their lightweight and their high processability. However, for application to a surface emitting device, an organic resin having improved electrical properties, mechanical strength, and optical properties would be desirable. In order to provide an organic resin having improved electrical properties, mechanical strength, and optical properties, research into a composite of an inorganic material and an organic material has been conducted.

To provide a plastic lens or a camera module, a transparent material having a high refractive index is desired. The high refractive index may be provided by including an inorganic particle having a high refractive index, such as zirconium oxide or titanium oxide, in an organic resin. To provide a suitably transparent material, the inorganic particle is desirably dispersed at the nanoscale level and without aggregation. However, because inorganic particles having a high refractive index, such as zirconium oxide or titanium oxide, also have high cohesion, suitably dispersing the inorganic particles in the organic resin is difficult.

In addition, the transparent material may be exposed to a high temperature, for example, in a metal deposition step of a mounting process. Accordingly, a transparent material also desirably provides high heat resistance. Currently available materials deteriorate during a mounting process performed at a high temperature.

Thus there remains a need for a high refractive index transparent material in which inorganic particles are suitably dispersed in a suitable organic resin on the nanoscale. Because inorganic particles with a high refractive index have high cohesion, and because of the high intermolecular binding forces of organic resins, it is difficult to provide a suitable dispersion of a high refractive index inorganic particle in an organic resin and provide sufficient heat resistance.

SUMMARY

Provided is a nanocomposite having excellent heat resistance, excellent transparency, and high refractive index. The nanocomposite may be provided by a method of uniformly dispersing inorganic particles having a high refractive index and high cohesion in a polyimide having strong intermolecular binding force.

Provided are methods of preparing the nanocomposite.

Provided is a surface emitting device including the nanocomposite and having high emission efficiency.

Additional aspects will be set forth in part in the description which follows and, in part, will be apparent from the description.

According to an aspect, a process for uniformly dispersing inorganic oxide particles having high refractive index in a polyimide or a poly(amic acid) having high heat resistance on the nanoscale includes modifying the surface of the inorganic oxide particles having high refractive index with an imide functional group, i.e., a functional group having an imide backbone, so that dispersibility of the inorganic oxide particles having high refractive index may be selectively improved in the polyimide having strong intermolecular binding force.

Disclosed is a nanocomposite including: a matrix including a polyimide; and surface-modified inorganic oxide particles disposed in the matrix, wherein a surface of a particle of the surface-modified inorganic oxide particles is modified with an imide functional group.

Also disclosed is a method of preparing a nanocomposite, the method including: providing surface-modified inorganic oxide particles having a surface modified with an imide functional group; contacting the surface-modified inorganic oxide particles with a poly(amic acid) to form a mixture; and heat-treating the mixture to form a polyimide and prepare the nanocomposite.

Also disclosed is a method of preparing a nanocomposite, the method including: providing surface-modified inorganic oxide particles having a surface modified with an imide functional group; contacting the surface-modified inorganic oxide particles with a diamine and an acid dianhydride to prepare a mixture of the surface-modified inorganic oxide particles and a poly(amic acid); and heat-treating the mixture to form a polyimide and prepare the nanocomposite.

Also disclosed is a method of preparing a nanocomposite, the method including: providing surface-modified inorganic oxide particles having a surface modified with an imide functional group; contacting the surface-modified inorganic oxide particles with a poly(amic acid) to form a mixture; and heat-treating the mixture to form a polyimide and prepare the nanocomposite.

Also disclosed is a surface emitting device including: a light-transmissive substrate including a transparent substrate and a coating layer disposed on the transparent substrate, wherein the coating layer includes a nanocomposite as disclosed above; a transparent conductive layer disposed on the light-transmissive substrate; and an organic EL layer disposed on the transparent conductive layer.

According to another aspect, a process for preparing a nanocomposite includes: preparing inorganic oxide particles having the surface modified with an imide functional group by modifying the surface of the inorganic oxide particles with an amino group-containing silane coupling agent represented by Formula 1 below or an amino group-containing phosphoric acid ester compound represented by Formula 2 below, and performing imidization of at least some of the amino groups; and mixing the surface-modified inorganic oxide particles, diamine, and acid dianhydride and reacting the diamine with acid dianhydride to prepare a mixture of the surface-modified inorganic oxide particles and PAA, and heat-treating the mixture.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
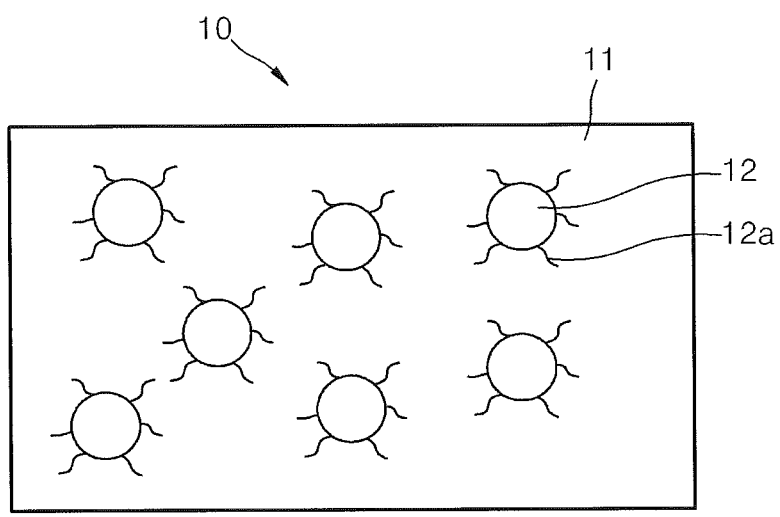
FIG. 1 illustrates a structure of an embodiment of a nanocomposite.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" means a straight or branched chain, saturated, monovalent hydrocarbon group (e.g., methyl or hexyl).

"Alkylene" means a straight or branched chain, saturated, divalent aliphatic hydrocarbon group, (e.g., methylene ($—CH_2—$) or, propylene ($—(CH_2)_3—$)).

"Aryl" means a monovalent group formed by the removal of one hydrogen atom from one or more rings of an arene (e.g., phenyl or napthyl).

"Arylene" means a divalent group formed by the removal of two hydrogen atoms from one or more rings of an arene, wherein the hydrogen atoms may be removed from the same or different rings (e.g., phenylene or naphthylene).

"Alkoxy" means an alkyl group that is linked via an oxygen (i.e., alkyl-O—), for example methoxy, ethoxy, and sec-butyloxy groups.

The prefix "hetero" means that the compound or group includes at least one a heteroatom (e.g., 1, 2, or 3 heteroatom(s)), wherein the heteroatom(s) is each independently N, O, S, Si, or P.

"Halogen" means one of the elements of Group 17 of the periodic table (e.g., fluorine, chlorine, bromine, iodine, and astatine).

"Substituted" means that the compound or group is substituted with at least one (e.g., 1, 2, 3, or 4) substituent independently selected from a hydroxyl (—OH), a C1-9 alkoxy, a C1-9 haloalkoxy, an oxo ($=O$), a nitro ($—NO_2$), a cyano (—CN), an amino ($—NH_2$), an azido ($—N_3$), an amidino ($—C(=NH)NH_2$), a hydrazino ($—NHNH_2$), a hydrazono ($—C(=NNH_2)—$), a carbonyl ($—C(=O)—$), a carbamoyl group ($—C(O)NH_2$), a sulfonyl ($—S(=O)_2—$), a thiol (—SH), a thiocyano (—SCN), a tosyl ($CH_3C_6H_4SO_2—$), a carboxylic acid (—C(=O)OH), a carboxylic C1 to C6 alkyl ester (—C(=O)OR wherein R is a C1 to C6 alkyl group), a carboxylic acid salt (—C(=O)OM) wherein M is an organic or inorganic anion, a sulfonic acid (—SO$_3$H$_2$), a sulfonic mono- or dibasic salt (—SO$_3$MH or —SO$_3$M$_2$ wherein M is an organic or inorganic anion), a phosphoric acid (—PO$_3$H$_2$), a phosphoric acid mono- or dibasic salt (—PO$_3$MH or —PO$_3$M$_2$ wherein M is an organic or inorganic anion), a C1 to C12 alkyl, a C3 to C12 cycloalkyl, a C2 to C12 alkenyl, a C5 to C12 cycloalkenyl, a C2 to C12 alkynyl, a C6 to C12 aryl, a C7 to C13 arylalkylene, a C4 to C12 heterocycloalkyl, and a C3 to C12 heteroaryl instead of hydrogen, provided that the substituted atom's normal valence is not exceeded.

In optical composites, inorganic particles are dispersed in an organic resin. So that the composite is transparent, the inorganic particles are desirably dispersed on a nanometer scale.

Because the composite is exposed to high heat when the component, e.g. a lens, is mounted, the composite desirably has high heat resistance. Polyimides are known in the art as having high heat resistance. However, when inorganic particles are dispersed in a polyimide, due to strong intermolecular binding forces, the inorganic particles undesirably aggregate due to interaction between the inorganic particles and the polyimide. It has been discovered that a surface-modified inorganic oxide particle having a functional group with an imide backbone can be uniformly dispersed in a polyimide to provide a nanocomposite. The nanocomposite comprising the polyimide and the surface-modified inorganic particle provides improved properties.

1. Structure of Nanocomposite

First, a structure of an embodiment of a nanocomposite according to will be further disclosed with reference to FIG. 1.

FIG. 1 illustrates a structure of an embodiment of a nanocomposite. Nanocomposite refers to a composite material in which particles of a material having a particle size ranging from about 1 to about 100 nanometers (nm) are dispersed in another material. Hereinafter, components and physical properties of the nanocomposite will be disclosed in further detail.

1.1. Components of the Nanocomposite

As shown in FIG. 1, in a nanocomposite 10, inorganic oxide particles 12 having a surface modified with a functional group are disposed in a matrix 11. The inorganic oxide particles 12 may be dispersed in the matrix 11. The inorganic oxide particles 12 may be disposed uniformly, non-uniformly, randomly, or non-randomly.

Matrix 11

The matrix 11, as a component of the nanocomposite 10, may comprise a polyimide. The polyimide is a polymer having an imide structure of the general formula (—C(=O)—N(R)—C(=O)—), for example, as shown in Formulas 3 and 4. However, polyimide, used herein may be an aromatic polyimide having a cyclic imide structure in which an aromatic compound is directly linked to an imide bond. Such polyimides may provide improved heat resistance and chemical stability. Furthermore, for optical use (for example, to provide a surface emitting device such as an organic electroluminescent (EL) device), a polyimide having high transparency and high refractive index may be used to form the matrix 11.

Formula 3

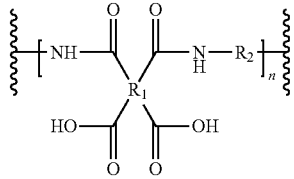

Formula 4

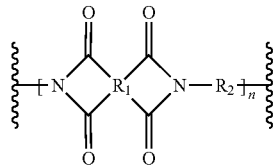

In this regard, the polyimide is a polymer prepared by copolymerization of monomers, i.e., a diamine represented by Formula 5 below and acid dianhydride represented by Formula 6 below. By selecting a suitable diamine and a suitable acid dianhydride, various types of polyimides may be synthesized.

Formula 5

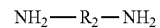

Formula 6

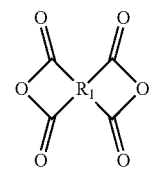

The use of the nanocomposite 10 is not particularly limited. However, if the nanocomposite 10 is used to form an optical component of a surface emitting device, such as an organic EL device, the polyimide used to form the matrix 11 desirably has a high refractive index, excellent transparency, and high heat resistance.

For this, a diamine, as a component of polyimide, may be any diamine having an aromatic ring, such as at least one selected from p-phenylenediamine, m-phenylenediamine, 2,4-diaminotoluene, 2,6-diamino toluene, benzidine, O-tridine, m-tridine, bis(trifluoromethyl)benzidine, octafluorobenzidine, 3,3'-dihydroxy-4,4'-diaminobiphenyl, 3,3'-dimethoxy-4,4'-diaminobiphenyl, 3,3'-dichloro-4,4'-diaminobiphenyl, 3,3'-difluoro-4,4'-diaminobiphenyl, 2,6-diaminonaphthalene, 1,5-diaminonaphthalene, 4,4'-diaminodiphenylether, 3,4'-diamino diphenylether, 4,4'-diamino diphenylmethane, 4,4'-diamino diphenylsulfone, 3,4'-diamino diphenylsulfone, 4,4'-diaminobenzophenone, 2,2-bis(4-(4-aminophenoxy)phenyl)propane, 2,2-bis(4-(2-methyl-4-aminophenoxy)phenyl)propane, 2,2-bis(4-(2,6-dimethyl-4-aminophenoxy)phenyl)propane, 2,2-bis(4-(4-aminophenoxy)phenyl)hexafluoropropane, 2,2-bis(4-(2-methyl-4-aminophenoxy)phenyl)hexafluoropropane, 2,2-bis (4-(2,6-dimethyl-4-aminophenoxy)phenyl) hexafluoropropane, 4,4'-bis(4-aminophenoxy)biphenyl, 4,4'-bis(2-methyl-4-aminophenoxy)biphenyl, 4,4'-bis(2,6-dimethyl-4-aminophenoxy)biphenyl, 4,4'-bis(3-amino phenoxy)biphenyl, bis(4-(4-aminophenoxy)phenyl)sulfone, bis(4-(2-methyl-4-aminophenoxy)phenyl)sulfone, bis(4-(2,6-dimethyl-4-aminophenoxy)phenyl)sulfone, bis(4-(4-aminophenoxy)phenyl)ether, bis(4-(2-methyl-4-aminophenoxy)phenyl)ether, bis(4-(2,6-dimethyl-4-aminophenoxy)phenyl)ether, 1,4-bis(4-aminophenoxy)benzene, 1,4-bis(2-methyl-4-aminophenoxy)benzene, 1,4-bis(2,6-dimethyl-4-aminophenoxy)benzene, 1,3-bis(4-amino phenoxy)benzene, 1,3-bis(2-methyl-4-aminophenoxy)benzene, 1,3-bis(2,6-dimethyl-4-aminophenoxy)benzene, 2,2-bis(4-aminophenyl)propane, 2,2-bis(2-methyl-4-amino phenyl)propane, 2,2-bis(2,6-dimethyl-4-amino phenyl)propane, 2,2-bis(4-amino phenyl)hexafluoropropane, 2,2-bis(2-methyl-4-aminophenyl)hexafluoropropane, 2,2-bis(2,6-dimethyl-4-aminophenyl)hexafluoropropane, α,α'-bis(4-aminophenyl)-1,4-diisopropylbenzene, α,α'-bis(2-methyl-4-amino phenyl)-1,4-diisopropylbenzene, α,α'-bis(2,6-dimethyl-4-aminophenyl)-1,4-diisopropylbenzene, α,α'-bis(3-aminophenyl)-1,4-diisopropylbenzene, α,α'-bis(4-amino phenyl)-1,3-diisopropylbenzene, α,α'-bis(2-methyl-4-aminophenyl)-1,3-diisopropylbenzene, α,α'-bis(2,6-dimethyl-4-aminophenyl)-1,3-diisopropylbenzene, α,α'-bis(3-aminophenyl)-1,3-diisopropylbenzene, 9,9-bis(4-amino phenyl)fluorene, 9,9-bis(2-methyl-4-amino phenyl)fluorene, 9,9-bis(2,6-dimethyl-4-amino phenyl)fluorene, 1,1-bis(4-aminophenyl)cyclopentane, 1,1-bis(2-methyl-4-aminophenyl)cyclopentane, 1,1-bis(2,6-dimethyl-4-aminophenyl)cyclopentane, 1,1-bis(4-aminophenyl)cyclohexane, 1,1-bis(2-methyl-4-aminophenyl)cyclohexane, 1,1-bis(2,6-dimethyl-4-aminophenyl)cyclohexane, 1,1-bis(4-aminophenyl)-4-methyl-cyclohexane, 1,1-bis(4-aminophenyl)nobornane, 1,1-bis(2-methyl-4-amino phenyl)nobornane, 1,1-bis(2,6-dimethyl-4-aminophenyl)nobornane, 1,1-bis(4-aminophenyl)adamantane, 1,1-bis(2-methyl-4-aminophenyl)adamantane, 1,1-bis(2,6-dimethyl-4-aminophenyl)adamantane, and 2,2'-bis(trifluoromethyl)benzidine. In order to improve transparency in a material having high refractive index, the polyimide may have an aromatic ring and a substituent providing an asymmetric property, such as —O— or —SO$_2$—. Thus, bis(3-aminophenyl)sulfone, which includes a sulfur atom, may be used.

In addition, the acid dianhydride may be any acid anhydride that has an aromatic ring, for example, at least one selected from pyromellitic acid dianhydride, 3,3',4,4'-biphenyltetracarboxylic acid dianhydride, 2,3,3',4'-biphenyltetracarboxylic acid dianhydride, 2,2-bis(3,4-dicarboxyphenyl)propanedianhydride, 2,2-bis(2,3-dicarboxyphenyl)propanedianhydride, 2,2-bis(3,4-dicarboxyphenyl)-1,1,1,3,3,3-hexafluoropropanedianhydride, 2,2-bis(2,3-dicarboxyphenyl)-1,1,1,3,3,3-hexafluoropropanedianhydride, bis(3,4-dicarboxyphenyl)sulfonedianhydride, bis(3,4-dicarboxyphenyl)etherdianhydride, bis(2,3-dicarboxyphenyl)ether dianhydride, 3,3',4,4'-benzophenonetetracarboxylic acid dianhydride, 2,2',3,3'-benzophenonetetracarboxylic acid dianhydride, 4,4'-(p-phenylenedioxy)diphthalic acid dianhydride, 4,4'-(m-phenylenedioxy)diphthalic acid dianhydride, ethylenetetracarboxylic acid dianhydride, 3-carboxymethyl-1,2,4-cyclopentanetricarboxylic acid dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, and 4,4'-(hexafluoroisopropylidene)diphthalic acid anhydride.

The diamine or acid dianhydride may be used alone or in a combination of at least two thereof, respectively.

In addition, to the above-described diamine or acid dianhydride, a diamine including silicon, a diamine having a side chain with an alkyl group, an acid, or the like, or an acid dianhydride, which does not deteriorate the refractive index or transparency and improves adhesive properties, may also be used. Particularly, the diamine including silicon may be KF8010, X-22-161A, or X-22-161B (Shin-Etsu Chemical Co., Ltd.), and the diamine having a side chain with an alkyl group may be 4,4'-diamino-3-dodecyldiphenylether, 1-octadecanoxy-2,4-diamino benzene, or the like.

Inorganic Oxide Particles 12

The inorganic oxide particle 12 of the nanocomposite 10, may comprise at least one inorganic oxide selected from zirconium oxide, yttria added (e.g., doped) zirconium oxide, lead zirconate, strontium titanate, tin titanate, tin oxide, bismuth oxide, niobium oxide, tantalum oxide, potassium tantalate, tungsten oxide, cerium oxide, lanthanum oxide, gallium oxide, silica, alumina, titanium oxide, zirconium oxide, and barium titanate (BT). The inorganic oxide is not limited thereto. Among these compounds, if the nanocomposite 10 is used for an optical component, titanium oxide, BT (which has a refractive index of about 2.4), zirconium oxide (which has a refractive index of about 2.1) may be used as the inorganic oxide particles. Titanium oxide generally has a rutile crystal structure (and has a refractive index of about 2.7) or an anatase crystal structure (which has a refractive index of about 2.5), but the anatase-type titanium oxide has high photocatalytic activity and is not suitable for optical use. Among these compounds, BT may be used as the inorganic oxide. BT provides high refractive index and has low photocatalytic activity.

In addition, an average particle diameter (e.g., average largest particle diameter) of the inorganic oxide particles 12 may be about 2 nm to 100 nm, specifically about 4 nm to about 90 nm, more specifically about 6 nm to about 80 nm. A median particle diameter (e.g., median largest particle diameter) of the inorganic oxide particles 12 may be about 2 nm to 100 nm, specifically about 4 nm to about 90 nm, more specifically about 6 nm to about 80 nm. If the average particle diameter of the inorganic oxide particles 12 is less than about 2 nm, the inorganic oxide particles 12 may not be sufficiently stable, may secondarily aggregate, and may be whitened during the formation of a film of the nanocomposite 10. Furthermore, particles having high crystallinity cannot be obtained if the average particle diameter of the inorganic oxide particles 12 is less than about 2 nm. If the average particle diameter of the inorganic oxide particles 12 is greater than about 100 nm, the nanocomposite 10 may not be uniformly formed, may not be suitably transparent, and a transparent composite cannot be obtained due to a high light scattering.

The average particle diameter used herein may be a number average particle diameter of primary particles. In addition, the average particle diameter of the inorganic oxide particles 12 may be measured by direct observation in which particle diameters of primary particles are directly measured using a transmission electron microscope (TEM).

In the nanocomposite 10, inorganic oxide particles 12 having a primary particle diameter in the range of about 2 nm to about 100 nm may be used as described above. Even if the primary particle diameter is within this range, the inorganic oxide particles 12 may aggregate if the inorganic oxide particles 12 are not uniformly and/or sufficiently dispersed in the matrix 11. This aggregation may be identified when the particle diameter of secondary particles formed by aggregation of primary particles is extremely large, wherein the particle diameter of the secondary particles is measured by dynamic light scattering. That is, the particle diameter measured by dynamic light scattering may be used as an index of the degree of dispersion. A desired degree of dispersion may be when an average particle diameter of the inorganic oxide particles 12 when measured by dynamic light scattering is less than 10 times the average particle diameter of the inorganic oxide particles 12 when measured by direct observation. In an embodiment, a ratio of the average particle diameter of the inorganic oxide particles 12 when measured by dynamic light scattering to the average particle diameter of the inorganic oxide particles 12 when measured by direct observation is about 1 to about 10, specifically about 2 to about 9, more specifically about 3 to about 8.

In this regard, a crystallinity of the inorganic particles 12 or a particle diameter of the inorganic oxide particles 12 may vary in a wide range according to the synthesis method. The inorganic oxide particles 12 may be synthesized by, for example, metal alkoxide polymerization (e.g., a SOL-GEL method) or a liquid phase method such as hydrothermal synthesis. The metal alkoxide polymerization may be performed by hydrolyzing a metal alkoxide, such as a barium or a titanium alkoxide, and forming a metal oxide by condensation-polymerization by dealcoholization or dehydration. In addition, the particle diameter of the inorganic oxide particles 12 may be selected by controlling the composition of the solvent used for the condensation-polymerization, a concentration of an aqueous solution, and a reaction temperature. In addition, a crystallinity of the produced inorganic oxide particles 12 increases as the reaction temperature increases, and the inorganic oxide particles 12 may become amorphous at a low temperature. Furthermore, the hydrothermal synthesis is a method of synthesizing oxide particles at a high temperature and at a high pressure in an airtight condition. Although the inorganic oxide particles 12 may be synthesized at a relatively low temperature using the hydrothermal synthesis method, the reaction time increases, operating costs increase and, purity decreases when compared with the metal alkoxide polymerization. Thus, metal alkoxide polymerization may be used.

Figure 2:
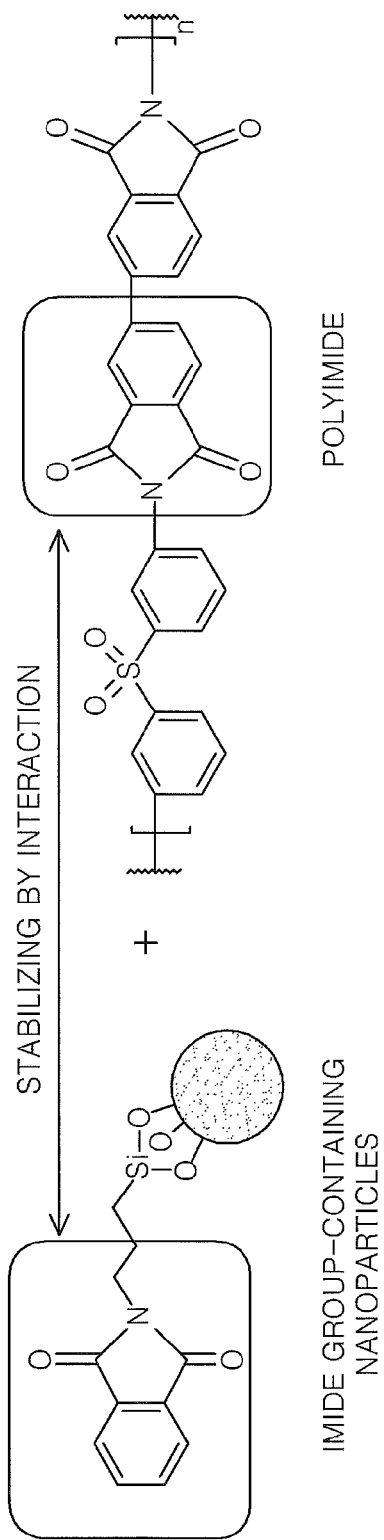
FIG. 2 illustrates an embodiment of surface-modified inorganic oxide particles having a modified surface.

In addition, a surface of the inorganic oxide particles 12 is modified with a substituent having an imide backbone. In this regard, referring to FIG. 2, the structure and function of the inorganic oxide particles 12 having a surface modified with an imide functional group will be further disclosed. FIG. 2 illustrates an embodiment of an inorganic oxide particle of the inorganic oxide particles 12.

Referring to FIG. 2, the inorganic oxide particles 12 have a surface modified with a substituent 12A that includes at least one imide backbone (imide structures) selected from substituents represented by Formulas 1a to 1d. As such, since the surface of the inorganic oxide particles 12 comprises an imide structure, the imide structure of the surface of the inorganic oxide particles 12 and the imide structure of the polyimide used in the matrix 11 are stabilized via interaction therebetween. Thus, the inorganic oxide particles 12 having a surface modified with a functional group including an imide backbone may have improved dispersibility in the polyimide. Furthermore, the dispersibility may be selective to the polyimide.

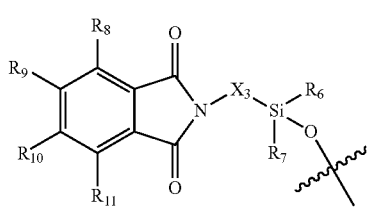

Formula 1a

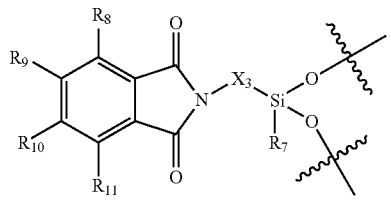

Formula 1b

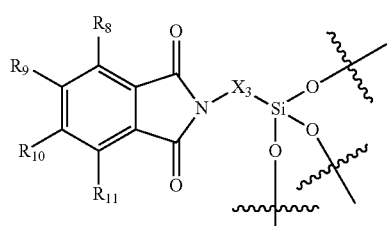

Formula 1c

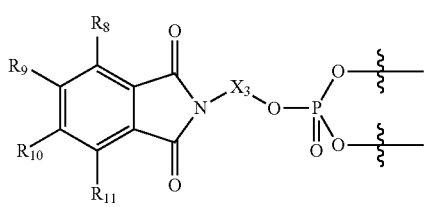

Formula 1d

In Formulas 1a to 1d, $X_3$ is independently selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group, $R_6$ and $R_7$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, a substituted or unsubstituted $C_4$-$C_{30}$ heteroaryl group, and a substituted or unsubstituted $C_1$-$C_{20}$ alkoxy group, and $R_8$, $R_9$, $R_{10}$ and $R_{11}$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, and a substituted or unsubstituted $C_4$-$C_{30}$ heteroaryl group.

In an embodiment, $X_3$ is an unsubstituted $C_1$-$C_{20}$ alkylene group, specifically propylene.

In an embodiment $R_8$, $R_9$, $R_{10}$ and $R_{11}$ are each independently hydrogen or an unsubstituted $C_1$-$C_{20}$ alkyl group, specifically hydrogen.

That is, by modifying the surface of the inorganic oxide particles 12 with the substituent 12A including an imide backbone, affinity with a polyimide (and its precursor, poly (amic acid) (PAA)) is improved and aggregation of the inorganic oxide particles 12 may be efficiently inhibited. While not wanting to be bound by theory, it is understood that affinity with the polyimide (and PAA) is improved according to the following reasons:

By introducing the imide structure onto the surface of the inorganic oxide particles 12, a hydrogen bond is formed between an oxygen of an imide carbonyl group of the surface of the inorganic oxide particles 12, and a hydrogen of an imide bond and a carboxyl group of PAA (that is a precursor of the polyimide), so that affinity between the inorganic oxide particles 12 and PAA is improved.

In addition, since the substituent 12A includes a benzene ring (and/or a phenyl group) in the imide structure, a stacking or charge transfer interaction occurs between the inorganic oxide particles 12 and the benzene ring of the polyimide or PAA so as to efficiently inhibit aggregation of the inorganic oxide particles 12.

Furthermore, the modification of the substituent 12A may be performed by imidization of the amino group introduced by surface-treatment with an amino group-containing silane coupling agent or an amino group-containing phosphoric acid ester compound, by reacting the amino group with acid anhydride. The surface modification and the amino group-containing silane coupling agent and the amino group-containing phosphoric acid ester compound will be further described below in more detail.

1.2. Physical Properties of Nanocomposite

The nanocomposite 10 may have physical properties (A) to (C) below.

(A) A refractive index of about 1.7 or greater, specifically about 1.7 to about 5, specifically about 1.8 to about 2.8.

(B) A haze value of about 10% or less, specifically about 1% to about 10%, specifically about 2% to about 9%.

(C) A 5% weight loss temperature, when measured by thermogravimetric-differential thermal analysis, of 450° C. or higher, specifically about 450° C. to about 600° C., more specifically about 475° C. to about 550° C.

Refractive Index

The nanocomposite 10 desirably has a high refractive index for optical use. A refractive index of the nanocomposite 10 may be 1.7 or greater, for example, in the range of 1.7 to 5.0. The nanocomposite 10 may have a refractive index of 1.7 or greater, since the inorganic oxide particles 12 having a high refractive index are dispersed in the matrix 11, and the refractive index of the matrix 11 may be designed to be increased.

The refractive index of the nanocomposite 10 may be selected using a charging rate of the inorganic oxide particles 12 in the matrix 11. The charging rate of the inorganic oxide particles 12 may be selected according to the composition of polyimide used in the matrix 11 and may be selected to provide a suitable refractive index according to the composition of the polyimide. If the charging rate of the inorganic oxide particles 12 is increased, the refractive index of the nanocomposite 10 may also be increased. However, the charging rate of the inorganic oxide particles 12 may be selected in consideration of a balance with refractive index and dispersibility of particles, since too high of a charging rate of the inorganic oxide particles 12 may deteriorate properties of the nanocomposite layer 10. Although the charging rate is not particularly limited, if spherical particles are used, the charging rate is, based on close packing of spheres, at most $\sqrt{2}\pi/6 \times 100\%$ or 74%, and thus, a real charge rate of the inorganic oxide particles 12 decreases therefrom. In an embodiment, the charging rate of the inorganic oxide particles 12 may be represented by a volume fraction of about 5 vol % to about 70 vol %, for example, about 10 vol % to about 65 vol %. If the charging rate of the inorganic oxide particles 12 is less than about 5%, the effect of adding the inorganic oxide particles 12 may be negligible. On the other hand, if the charging rate of the inorganic oxide particles 12 is greater than about 70%, a film may not be difficult to form due to a low content of the organic resin.

Transparency

The nanocomposite 10 desirably provides high transparency, e.g., a transparency suitable for optical use. In order to improve transparency of the nanocomposite 10, the transparency of the matrix 11 is desirably improved, and the dispersibility of the inorganic oxide particles 12 is also desirably improved. As described above, the surface of the inorganic oxide particles 12 is modified with the substituent 12A including an imide backbone. Thus, the dispersibility may be selectively improved by interaction with the polyimide used in the matrix 11. Accordingly, the nanocomposite 10 may have improved transparency. According to an embodiment, as an index of transparency, a turbidity (e.g., a haze value) is used. The haze value of the nanocomposite 10 may be about 10% or less, for example, about 10% to about 0.1%, specifically about 8% to about 0.5%.

Furthermore, the haze value according to the current embodiment is a ratio (or percentage) of light that is not vertically incident on the nanocomposite 10 layer with respect to light vertically incident on the nanocomposite 10 layer. The haze value may be easily measured using a commercially available integrating sphere-installed transmissivity meter or a haze meter.

Heat Resistance

The nanocomposite 10 also desirably has a heat resistance suitably for optical use since the nanocomposite 10 is exposed to a high temperature during a mounting process. In order to improve heat resistance of the nanocomposite 10, the heat resistance of the matrix 11 is desirably improved, and accordingly, a polyimide having high heat resistance is used to form the matrix 11 according to the current embodiment. According to an embodiment, a 5% weight loss temperature measured by thermogravimetric-differential thermal analysis is used as an index of heat resistance, and the 5% weight loss temperature may be 450° C. or higher, for example, in the range of 450° C. to 1,000° C. The 5% weight loss temperature may be measured using a thermogravimetric-differential thermal analysis (TG/DTA) device, by measuring a temperature when the weight of the nanocomposite 10 is reduced by 5% in a nitrogen atmosphere.

1.3. Identification of Structure of Nanocomposite

The modification of the surface of the inorganic oxide particles 12 with an imide structure may be identified using a TG/DTA device, an FT-IR device, or the like. Particularly, if a TG/DTA device is used, the weight difference between the inorganic oxide particles 12 having an unmodified surface and the inorganic oxide particles 12 having a modified surface is measured at a predetermined temperature (for example, at 350° C.). If the weight of the inorganic oxide particles 12 having the modified surface is greater than that of the inorganic oxide particles 12 having the unmodified surface, it may be determined that the surface of the inorganic oxide particles 12 is modified. Alternatively, if an FT-IR is used, when a C—N stretching vibration of the imide ring at around 1390 inverse centimeters ($cm^{-1}$) and a benzene skeletal vibration at around 1550 $cm^{-1}$ are observed, it may be determined that the surface of the inorganic oxide particles 12 is modified with a substituent including an imide backbone.

The dispersibility of the inorganic oxide particles 12 having the modified surface in polyimide may be measured by using dynamic light scattering or by using a TEM.

2. Preparation of Nanocomposite

The structure of the nanocomposite 10 is disclosed above in further detail. Hereinafter, a method of preparing the nanocomposite 10 will be disclosed in further detail. A method of modifying the surface of the inorganic oxide particles 12, a method of synthesizing polyimide, and a method of preparing a nanocomposite will be further disclosed.

First, before describing the method of modifying the surface of the inorganic oxide particles 12, raw materials used to form the nanocomposite 10 will be described.

It is difficult to increase the refractive index of the nanocomposite 10 to 1.7 or greater by only using a resin having a sulfur (S) atom, a benzene ring, or a naphthalene ring as an organic component. Inorganic particles having a high refractive index between the organic components can be used to obtain a high refractive index. In addition, since a high refractive index of the nanocomposite 10 may be efficiently obtained by increasing the refractive index of the organic component (e.g., the polyimide) of the matrix, the polyimide structure may have an aromatic backbone, an acid anhydride with a sulfur atom, and a diamine.

In addition, the haze value is related to transparency and scattering of a layer. Thus, in order to reduce the haze value to 10% or less, inorganic particles having a high refractive index are desirably dispersed in the matrix 11 at on a nanometer scale. According to an embodiment, the inorganic oxide particles 12 having a nanosize particle diameter may be used as the inorganic particles having high refractive index.

In addition, since decomposition or degradation of many organic materials (e.g., polymers) is initiated at around 300° C., the 5% weight loss temperature cannot be 450° C. or less by using an acryl resin or an epoxy resin as the matrix 11. However, and while not wanting to be bound by theory, it is understood that the polyimide provides higher heat resistance due to strong intermolecular binding forces. In addition, due to an aromatic ring, a strong conjugated structure is formed between the imide backbone and the aromatic ring, so that heat resistance is further improved. Thus, the polyimide used herein may include a component having an aromatic ring.

Hereinafter, the method of preparing the nanocomposite 10 will be disclosed in further detail.

2.1. Method of Modifying Surface of Inorganic Oxide Particles

First, the surface of the inorganic oxide particles 12 synthesized as described above was treated with an amino group-containing silane coupling agent or an amino group-containing phosphoric acid ester compound to introduce an amino group to the surface of the inorganic oxide particles 12. In order to introduce the amino group to the surface of the inorganic oxide particles 12, an amino group-containing silane coupling agent represented by Formula 1 or an amino group-containing phosphoric acid ester compound represented by Formula 2 may be used.

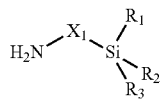

Formula 1

In Formula 1, $X_1$ is selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group, and $R_1$, $R_2$, and $R_3$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, a substituted or unsubstituted $C_4$-$C_{30}$ heteroaryl group, and a substituted or unsubstituted $C_1$-$C_{20}$ alkoxy group.

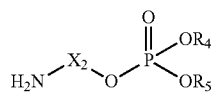

Formula 2

In Formula 2, $X_2$ is selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group, and $R_4$ and $R_5$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, and a substituted or unsubstituted $C_4$-$C_{30}$ heteroaryl group.

The silane coupling agent may become an oligomer by self condensation, but the phosphoric acid ester does not self-condense but coordinates with oxide inorganic particles 12 in a single layer.

In this regard, the amino group-containing silane coupling agent may be any compound represented by Formula 1, for example, at least one selected from aminopropyltrimethoxysilane, aminopropyltriethoxysilane, N-2-(aminoethyl)-3-aminopropylmethyldimethoxysilane, N-2-(aminoethyl)-3-aminopropyltriethoxysilane, and N-2-(aminoethyl)-3-aminopropyltriethoxy silane, but is not limited thereto. Among these compounds, aminopropyltrimethoxysilane and aminopropyltriethoxysilane are specifically mentioned.

The amino group-containing phosphoric acid ester compound may be a compound represented by Formula 2, for example, O-phosphorylethanolamine.

The details of a method of modifying the surface of inorganic oxide particles by using a silane coupling agent or a phosphoric acid ester compound can be determined by one of skill in the art. However, if a silane coupling agent having a polar terminal group such as an amino group is used, hydrogen of $NH_2$ forms a hydrogen bond with an —OH group of the polyimide or the inorganic oxide particles, so that an interaction between the inorganic oxide particles and the polyimide or among the inorganic oxide particles becomes stronger and may cause aggregation of the inorganic oxide particles. Although the aggregation may be inhibited by extending the distance between particles using a silane coupling agent or a dispersant having an organic component with a long chain, heat resistance may deteriorate due to the increase in the content of the organic component and the layer may deteriorate when exposed to a high-temperature treatment.

Thus imidization of the amino group by reacting the amino group with an acid anhydride and adding a dehydrating condensing agent thereto has been used in order to improve durability at a high temperature and dispersibility in the polyimide. Imidization of the surface of the inorganic oxide particles 12 may modify the surface by bonding an imide group thereto, and compatibility with the polyimide may be improved. Accordingly, aggregation of the inorganic oxide particles 12 may be inhibited and the inorganic oxide particles 12 may be uniformly dispersed in a solution on the nanoscale.

According to a method of coating inorganic oxide particles with a poly(amic acid) (PAA) or a polyimide having silicon at both ends thereof, aggregation of particles may be accelerated since PAA has a strong intermolecular binding force, so that it is difficult to disperse the inorganic oxide particles on the nanoscale in the PAA or polyimide. However, according to an embodiment, since the imidization is performed after coating the particles with the amino group-containing silane coupling agent and/or the amino group-containing phosphoric acid ester compound in a previous step, 1:1 imidization with the amino group of the surface of the particles may be performed and the production of polymers causing aggregation may be inhibited.

The acid anhydride used in the imidization may comprise at least one selected from maleic anhydride, succinic anhydride, phthalic anhydride, tetrahydrophthalic acid, and glutaric acid. In order to improve dispersibility in an aromatic polyimide having a high heat resistance, an acid anhydride having an aromatic ring such as phthalic anhydride may be used. For example, an acid anhydride represented by Formula 8 may be used.

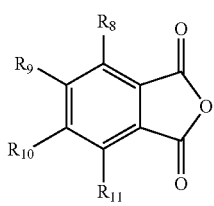

Formula 8

In Formula 8, $R_8$, $R_9$, $R_{10}$ and $R_{11}$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, and a substituted or unsubstituted $C_4$-$C_{30}$ heteroaryl group. In an embodiment in Formula 8, $R_8$, $R_9$, $R_{10}$ and $R_{11}$ are all hydrogen.

As described above, the surface of the inorganic oxide particles is modified with an amino group-containing silane coupling agent represented by Formula 1 or an amino group-containing phosphoric acid ester compound represented by Formula 2 to provide amino-functionalized inorganic oxide particles, and then at least some of the amino groups are imidized to obtain inorganic oxide particles having a surface modified with an imide functional group.

In this regard, and while not wanting to be bound by theory, a mechanism of modifying the surface of the inorganic oxide particles 12 with a substituent 12A having an imide backbone will be further described with reference to FIGS. 3 and 4.

Figure 3:
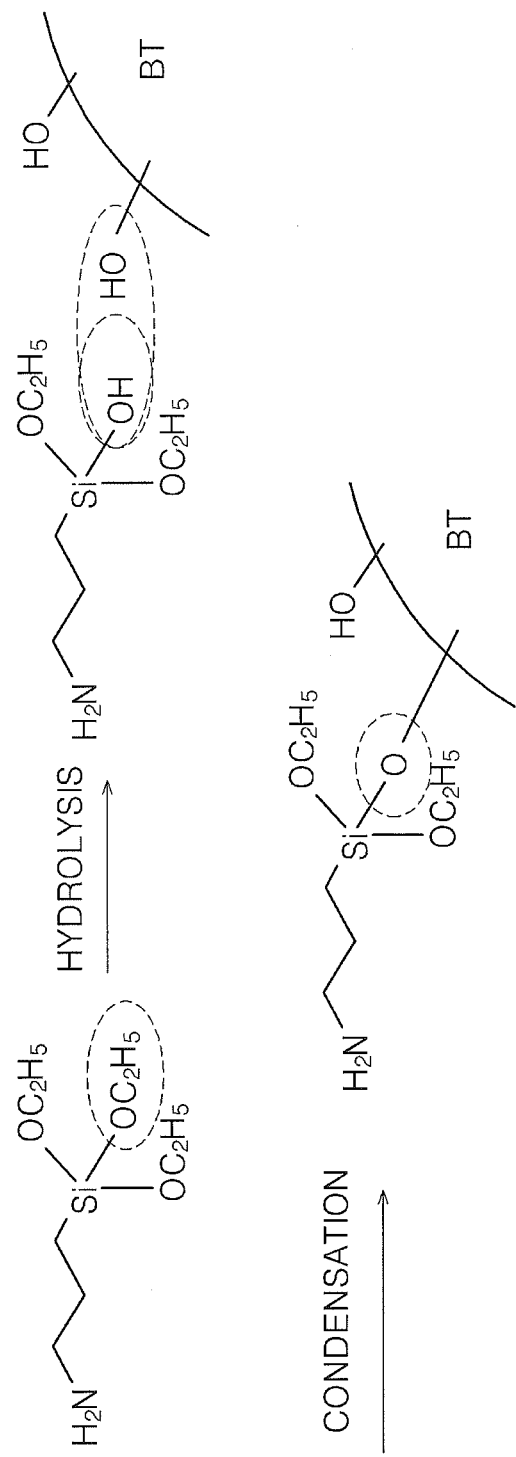
FIG. 3 illustrates an embodiment of a mechanism of introducing an amino group onto the surface of an inorganic oxide particle.

FIG. 3 illustrates a mechanism of an embodiment of introducing an amino group onto the surface of inorganic oxide particles 12. FIG. 4 illustrates a mechanism of an embodiment of imidization of an amino group introduced onto the surface of inorganic oxide particles 12. In an embodiment, barium titanate (BT) particles are used as the inorganic oxide particles 12, 3-aminopropyltriethoxysilane (APTES) is used as the silane coupling agent for introducing an amino group to the surface of the inorganic oxide particles 12, and phthalic anhydride is used as acid anhydride for imidization of the amino group introduced onto the surface of the inorganic oxide particles 12.

First, as shown in FIG. 3, the silane coupling agent (e.g., APTES) hydrolyzes a hydroxyl group of the surface of the inorganic oxide particles 12 (e.g., BT particles) for condensation to occur, so that the amino group may be introduced onto the inorganic oxide particles 12.

Figure 4:
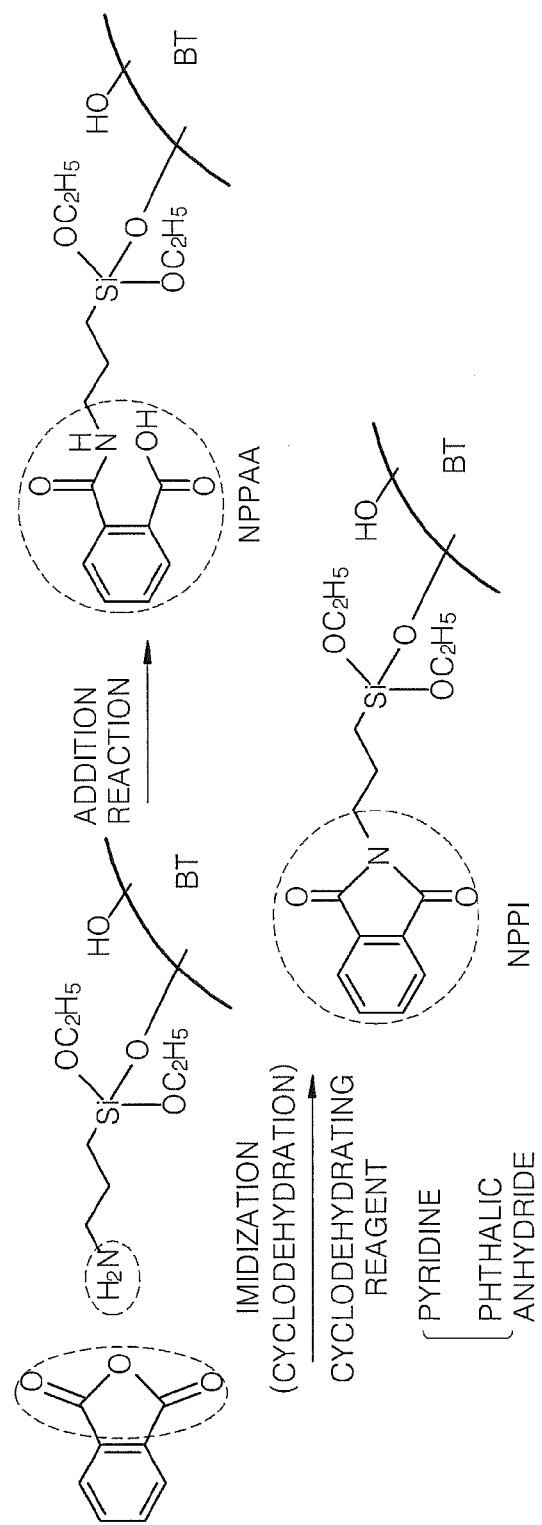
FIG. 4 illustrates an embodiment of a mechanism of imidization of an amino group introduced onto the surface of an inorganic oxide particle.

Then, the imidization of the amino group introduced onto the surface of the inorganic oxide particles 12 is performed through two reactions shown in FIG. 4. First, an addition reaction between the acid anhydride (e.g., phthalic anhydride) and the amino group of the surface of the inorganic oxide particles 12 modified by the silane coupling agent (e.g., APTES) occurs so that an amic acid (N-propylamic acid (NPPAA)) is produced. Then, the produced amic acid is chemically imidized by a cyclodehydrating reagent (e.g., phthalic anhydride and pyridine), so that an imide structure (e.g., N-propylphthalimide (NPPI) herein) may be introduced onto the surface of the inorganic oxide particles 12. Here, phthalic anhydride acts not only as a source of phthalimide, and thus is a reactant in a reaction with the amino group of the surface of the particles, but also a cyclodehydrating reagent for causing imidization in the presence of pyridine.

2.2. Method of Synthesizing Polyimide

The method of synthesizing polyimide used to form the matrix 11 may be a two-step synthesis including the preparation of PAA that is a precursor, and a one-step synthesis that does not include preparation of PAA, but is not limited thereto. The two-step synthesis may be used in an industrial production. According to the two-step synthesis, imidization may be performed by a heat treatment at about 250° C. or higher, specifically at about 250° C. to about 350° C. In addition, the imide may be obtained by partially chemical condensing the PAA using acetic anhydride, pyridine, or the like. Hereinafter, the two-step synthesis and the one-step synthesis will be disclosed in further detail.

Two-Step Synthesis

The two-step synthesis is a method of synthesizing the polyimide (PI) by synthesizing a PAA having a high solubility in an organic solvent and excellent processibility, and then performing imidization of the PAA. The PAA is prepared by mixing a diamine represented by Formula 5, as a monomer of the PAA, and an acid dianhydride represented by Formula 6 in an aprotic organic solvent as shown in Reaction Scheme 1 below. In this regard, the PAA may be efficiently synthesized by sequentially dissolving the monomers in a solvent in a nitrogen atmosphere in order to avoid contact with moisture and oxygen in the air and stirring the mixture at room temperature for a selected period of time, for example, for about 15 hours, specifically about 1 to about 30 hours.

Reaction Scheme 1

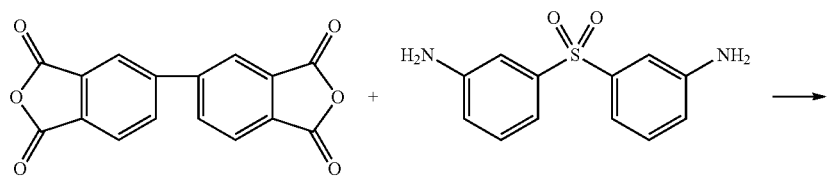

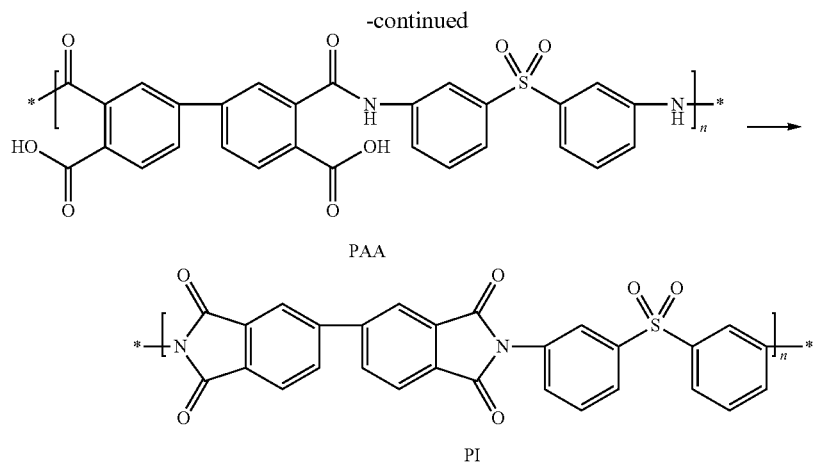

PAA

PI

As further described above, the diamine, as an ingredient of the polyimide according to an embodiment, may be any suitable diamine including an aromatic ring, such as at least one selected from p-phenylenediamine, m-phenylenediamine, 2,4-diaminotoluene, 2,6-diamino toluene, benzidine, O-tridine, m-tridine, bis(trifluoromethyl)benzidine, octafluorobenzidine, 3,3'-dihydroxy-4,4'-diaminobiphenyl, 3,3'-dimethoxy-4,4'-diaminobiphenyl, 3,3'-dichloro-4,4'-diaminobiphenyl, 3,3'-difluoro-4,4'-diaminobiphenyl, 2,6-diaminonaphthalene, 1,5-diaminonaphthalene, 4,4'-diaminodiphenylether, 3,4'-diamino diphenylether, 4,4'-diamino diphenylmethane, 4,4'-diamino diphenylsulfone, 3,4'-diamino diphenylsulfone, 4,4'-diaminobenzophenone, 2,2-bis(4-(4-aminophenoxy)phenyl)propane, 2,2-bis(4-(2-methyl-4-aminophenoxy)phenyl)propane, 2,2-bis(4-(2,6-dimethyl-4-aminophenoxy)phenyl)propane, 2,2-bis(4-(4-aminophenoxy)phenyl)hexafluoropropane, 2,2-bis(4-(2-methyl-4-aminophenoxy)phenyl)hexafluoropropane, 2,2-bis(4-(2,6-dimethyl-4-aminophenoxy)phenyl) hexafluoropropane, 4,4'-bis(4-aminophenoxy)biphenyl, 4,4'-bis(2-methyl-4-aminophenoxy)biphenyl, 4,4'-bis(2,6-dimethyl-4-aminophenoxy)biphenyl, 4,4'-bis(3-amino phenoxy)biphenyl, bis(4-(4-aminophenoxy)phenyl)sulfone, bis(4-(2-methyl-4-aminophenoxy)phenyl)sulfone, bis(4-(2,6-dimethyl-4-aminophenoxy)phenyl)sulfone, bis(4-(4-aminophenoxy)phenyl)ether, bis(4-(2-methyl-4-aminophenoxy)phenyl)ether, bis(4-(2,6-dimethyl-4-aminophenoxy)phenyl)ether, 1,4-bis(4-aminophenoxy)benzene, 1,4-bis(2-methyl-4-aminophenoxy)benzene, 1,4-bis(2,6-dimethyl-4-aminophenoxy)benzene, 1,3-bis(4-amino phenoxy)benzene, 1,3-bis(2-methyl-4-aminophenoxy)benzene, 1,3-bis(2,6-dimethyl-4-aminophenoxy)benzene, 2,2-bis(4-aminophenyl)propane, 2,2-bis(2-methyl-4-amino phenyl)propane, 2,2-bis(2,6-dimethyl-4-amino phenyl)propane, 2,2-bis(4-amino phenyl)hexafluoropropane, 2,2-bis(2-methyl-4-aminophenyl)hexafluoropropane, 2,2-bis(2,6-dimethyl-4-aminophenyl)hexafluoropropane, α,α'-bis(4-aminophenyl)-1,4-diisopropylbenzene, α,α'-bis(2-methyl-4-amino phenyl)-1,4-diisopropylbenzene, α,α'-bis(2,6-dimethyl-4-aminophenyl)-1,4-diisopropylbenzene, α,α'-bis(3-aminophenyl)-1,4-diisopropylbenzene, α,α'-bis(4-amino phenyl)-1,3-diisopropylbenzene, α,α'-bis(2-methyl-4-aminophenyl)-1,3-diisopropylbenzene, α,α'-bis(2,6-dimethyl-4-aminophenyl)-1,3-diisopropylbenzene, α,α'-bis(3-aminophenyl)-1,3-diisopropylbenzene, 9,9-bis(4-amino phenyl)fluorene, 9,9-bis(2-methyl-4-amino phenyl)fluorene, 9,9-bis(2,6-dimethyl-4-amino phenyl)fluorene, 1,1-bis(4-aminophenyl) cyclopentane, 1,1-bis(2-methyl-4-aminophenyl)cyclopentane, 1,1-bis(2,6-dimethyl-4-aminophenyl)cyclopentane, 1,1-bis(4-aminophenyl)cyclohexane, 1,1-bis(2-methyl-4-aminophenyl)cyclohexane, 1,1-bis(2,6-dimethyl-4-aminophenyl)cyclohexane, 1,1-bis(4-aminophenyl)-4-methyl-cyclohexane, 1,1-bis(4-aminophenyl)nobornane, 1,1-bis(2-methyl-4-amino phenyl) nobornane, 1,1-bis(2,6-dimethyl-4-aminophenyl) nobornane, 1,1-bis(4-aminophenyl)adamantane, 1,1-bis(2-methyl-4-aminophenyl)adamantane, 1,1-bis(2,6-dimethyl-4-aminophenyl)adamantane, and 2,2'-bis(trifluoromethyl) benzidine. Since a substituent that has an aromatic ring and provides an asymmetric property, such as —O— or —SO$_2$—, may be introduced into polyimide in order to improve transparency of a high refractive index material, bis(3-aminophenyl)sulfone having a sulfur atom may be used.

In addition, the acid dianhydride may be any acid anhydride that has an aromatic ring, for example, at least one selected from pyromellitic acid dianhydride, 3,3',4,4'-biphenyltetracarboxylic acid dianhydride, 2,3,3',4'-biphenyltetracarboxylic acid dianhydride, 2,2-bis(3,4-dicarboxyphenyl) propanedianhydride, 2,2-bis(2,3-dicarboxyphenyl) propanedianhydride, 2,2-bis(3,4-dicarboxyphenyl)-1,1,1,3,3,3-hexafluoropropanedianhydride, 2,2-bis(2,3-dicarboxyphenyl)-1,1,1,3,3,3-hexafluoropropanedianhydride, bis(3,4-dicarboxyphenyl) sulfonedianhydride, bis(3,4-dicarboxyphenyl) etherdianhydride, bis(2,3-dicarboxyphenyl)ether dianhydride, 3,3',4,4'-benzophenonetetracarboxylic acid dianhydride, 2,2',3,3'-benzophenonetetracarboxylic acid dianhydride, 4,4'-(P-phenylenedioxy)diphthalic acid dianhydride, 4,4'-(m-phenylenedioxy)diphthalic acid dianhydride, ethylenetetracarboxylic acid dianhydride, 3-carboxymethyl-1,2,4-cyclopentanetricarboxylic acid dianhydride, 1,1-bis(2,3-dicarboxyphenyl)ethane dianhydride, bis(2,3-dicarboxyphenyl)methane dianhydride, bis(3,4-dicarboxyphenyl) methane dianhydride, and 4,4'-(hexafluoroisopropylidene) diphthalic acid anhydride.

As ingredients of the PAA and the polyimide, in addition to the polymer described above, a diamine and/or an acid dianhydride including silicon, a carboxylic acid group, and the like, may be used to improve cohesion to a substrate such that refractive index and transparency do not degrade. Particularly, the diamine including silicon may be KF8010, X-22-161A, or X-22-161B (Shin-Etsu Chemical Co., Ltd.). Also, the diamine may comprise a side chain including an alkyl group, such as 4,4'-diamino-3-dodecyldiphenylether, 1-octadecanoxy-2,4-diamino benzene, or the like.

In addition, the organic solvent used to synthesize the PAA solution may be an aprotic polar solvent such as formamide, for example, N,N-dimethylformamide and N,N-diethylformamide, aceteamide, for example, N,N-dimethylaceteamide and N,N-diethylaceteamide, or pyrrolidone, for example, N-methyl-2-pyrrolidone (NMP), and the organic solvent may be used alone or in a combination.

In addition, the two-step synthesis may include a heating imidization and/or a chemical imidization step.

The heating imidization is imidization performed by heating the PAA at about 250° C. or higher in a nitrogen atmosphere. Imidization may be efficiently performed by heating the PAA at about 250° C. or higher, specifically about 250° C. to about 450°, specifically about 275° C. to about 425° C. In addition, if desired, the imidization may be performed at a lower temperature by adding a reaction catalyst, such as at least one catalyst selected from 3-hydroxypyridine, 4-hydroxypyridine, phthalazine, and benzimidazole.

The chemical imidization is imidization performed using a cyclodehydrating reagent, which is a mixture of an acid anhydride and a tertiary amine, such as acetic anhydride and pyridine, at a temperature ranging from room temperature to about 100° C., specifically about 20° C. to about 80° C. According to an embodiment, the polyimide may be prepared using the heating imidization and/or the chemical imidization as desired.

One-Step Synthesis

The one-step synthesis is a method of synthesizing a polyimide (PI) in an amide-based or phenol-based solvent, not via PAA. For example, the PI may be synthesized by dissolving monomers having the same molar quantities in a solvent, such as m-cresol, and performing a reaction for several hours at 200° C. in the presence of a basic solvent such as isoquinoline.

2.3. Method of Preparing Nanocomposite

According to the method described above, inorganic oxide particles having high refractive index which are dispersible at a nanosize level, and PAA and polyimide having high refractive index may be obtained. By mixing the components using a suitable method, inorganic oxide particles having high refractive index may be dispersed in a solution of the PAA and/or the polyimide having high heat resistance at a suitable filling rate while inhibiting aggregation, and a nanocomposite having a high refractive index of 1.7 or greater may be prepared.

Furthermore, if desired, at least one selected from an adhering coagent, a surfactant, a thermal acid generator, and the like may also be used in the preparation of the nanocomposite, in addition to the above-described components.

Hereinafter, a method of preparing a nanocomposite using the inorganic oxide particles and the polyimide and/or the PAA will be further disclosed.

A first method includes the following two processes: First, by a first process, inorganic oxide particles having a surface modified as described above are prepared. Then, by a second process, the inorganic oxide particles having a surface modified in the first process is mixed with PAA obtained by the two-step synthesis, and the mixture is heat-treated. The heat treatment may be performed at 250° C. or higher, specifically about 250° C. to about 450°, specifically about 275° C. to about 425° C., to imidize the PAA as described above.

As such, the first method (hereinafter, referred to as "direct mixing") is a method of preparing a nanocomposite, in which the inorganic oxide particles are dispersed in a matrix comprising the polyimide, by directly mixing the surface-modified inorganic oxide particles and PAA. However, in the direct mixing method, the viscosity rapidly changes since the inorganic oxide particles are added to the highly viscous PAA solution, and the inorganic oxide particles may easily aggregate. Although the aggregates may be re-dispersed by irradiating with ultrasonic waves, the re-dispersion may take a long period of time.

A second method (hereinafter, referred to as "in-situ polymerization") includes mixing the inorganic oxide particles and the PAA by polymerizing PAA in a suspension of the surface-modified inorganic oxide particles.

More particularly, the second method (i.e., in-situ polymerization) includes a first process by which the surface-modified inorganic oxide particles are obtained as in the direct mixing method. Then, in a second process, the surface-modified inorganic oxide particles, diamine, and acid dianhydride are mixed, the diamine and acid dianhydride react, a mixture of the surface-modified inorganic oxide particles and PAA is prepared, and the mixture is heat-treated. The heat treatment may be the same as that of the direct mixing, i.e., 250° C. or higher, specifically about 250° C. to about 450°, specifically about 275° C. to about 425° C.

In the in-situ polymerization as described above, the mixing may be performed while gradually increasing the viscosity, and aggregation of the inorganic oxide particles may be inhibited during the mixing while the viscosity is not rapidly changed. In addition, if the in-situ polymerization method is used, a period of time to form a composite of the inorganic oxide particles and the polyimide, including the imidization of the PAA, may be considerably reduced.

3. Structure of a Surface Emitting Device

Figure 5:
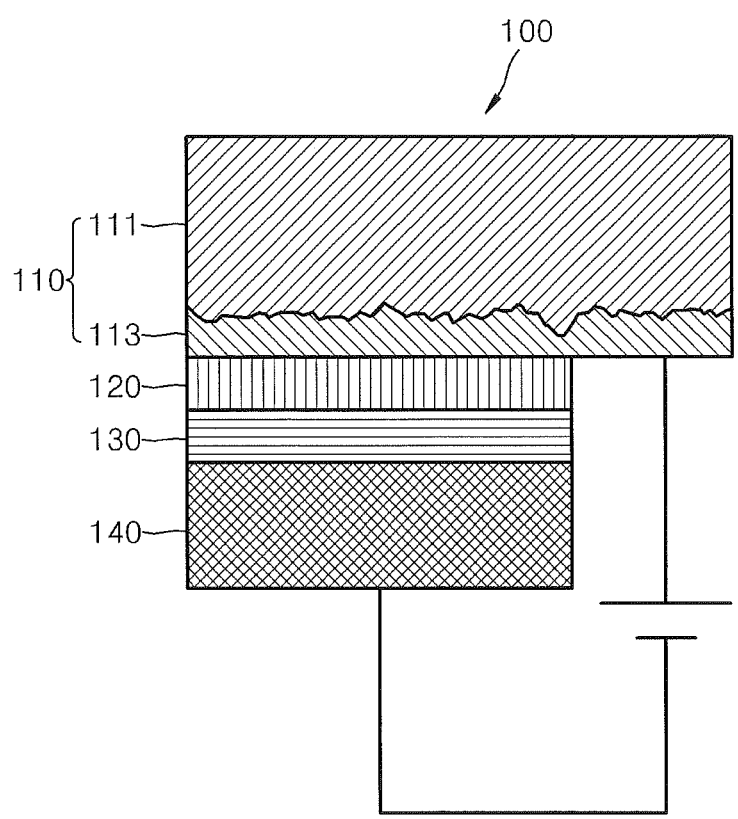
FIG. 5 illustrates a cross-sectional view of an embodiment of a surface emitting device.

Hereinafter, referring to FIG. 5, the structure of an embodiment of a surface emitting device using the nanocomposite 10 is further disclosed. FIG. 5 illustrates a cross-sectional view of an embodiment of a surface emitting device 100.

Referring to FIG. 5, the surface emitting device 100 includes a light-transmissive substrate 110, a transparent conductive layer (e.g., transparent electrode) 120, an organic electroluminescent (EL) layer 130, and a negative electrode 140.

In the surface emitting device 100, which may be an organic EL device, light emitted from a fluorescent material contained in the organic EL layer 130, which may be an emission layer, omnidirectionally irradiates with respect to the fluorescent material to the air via a hole transport layer (HTL) (not shown), the transparent conductive layer 120, which is a positive electrode, and the light-transmissive substrate 110. Alternatively, the light may proceed in a reverse direction (i.e., away from the light-transmissive substrate 110), reflect from the negative electrode 140, and may be emitted to the air via the organic EL layer 130, the HTL, the transparent conductive layer 120, and/or via the light-transmissive substrate 110. However, if a refractive index of an incident medium is greater than that of an exit medium, light incident on the interface between the media at an angle greater than an angle at which an exit angle of a refracted light is 90°, i.e., a threshold angle, cannot pass the interface, so that the light is totally reflected. Thus, the light cannot be emitted into the air.

The relationship between a refraction angle of light and a refractive index of a medium at an interface between different media generally follows Snell's law. According to Snell's law, if light proceeds from a first medium having a refractive index $N1$ to a second medium having a refractive index $N2$, the relationship between the incident angle $\theta1$ and a refraction angle $\theta2$ is $N1 \sin(\theta1)=N2 \sin(\theta2)$. According to this equation, if $N1>N2$, the incident angle $\theta1=\arcsin(N2/N1)$ at θ2=90° is referred to as a threshold angle. If the incident angle is greater than the threshold angle, light is totally reflected by the interface between the first medium and the second medium. Thus, in a surface emitting device which isotropically emits light, light irradiating at an angle greater than the threshold angle is repeatedly totally reflected by the interface and trapped in the surface emitting device, so that the light cannot be irradiated into the air.

As such, the surface emitting device has low emission efficiency. According to an embodiment, the light-transmissive substrate 110 is prepared by disposing a coating layer 113 comprising the nanocomposite having a high refractive index on the transparent substrate 111 having an uneven surface to provide a layer which converts the exit angle of the light. Accordingly, light that is totally reflected by the interface of layers according to Snell's law and trapped in the surface emitting device may be emitted to the outside of the surface emitting device (and into the air). Hereinafter, each of the components of the surface emitting device 100 will be disclosed in further detail.

Light-Transmissive Substrate 110

The light-transmissive substrate 110 comprises a transparent substrate 111 and the coating layer 113 that is disposed on the transparent substrate 111. The coating layer 113 comprises the nanocomposite.

The transparent substrate 111 comprises a transparent material such as glass, e.g., at least one glass selected from a soda lime glass, an alkali-free glass, and a transparent plastic. The transparent plastic used to form the light-transmissive substrate 110 may comprise at least one selected from an insulating organic material, such as polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAO), and cellulose acetate propionate (CAP), and the like.

The transparent substrate 111 has an uneven surface. The uneven surface may comprise regular or irregular modulations, and the modulations may be concave or convex. The uneven surface may be formed by any known method, for example, sand blasting, thermal imprinting, and chemical etching. The uneven surface may have random concave and/or convex portions which cause disorder of the refraction angle of the incident light when light generated in the organic EL layer 130 passes through the transparent conductive layer 120 and is incident onto the light-transmissive substrate 110. Alternatively, the uneven surface may have a uniform structure, such as a lens structure or a pyramidal structure. As such, if the transparent substrate 111 has an uneven surface, light incident on the uneven surface is scattered. Thus, a rate of light transmitting through the transparent substrate 111 without changing its direction relative to light proceeding in a direction perpendicular to the transparent substrate 111 is reduced. If the scattering light increases (i.e., light that transmits in a non-perpendicular direction), emission efficiency of the surface emitting device 100 may be increased.

In addition, the coating layer 113 may be disposed on the transparent substrate 111 by coating a mixture of the surface-modified inorganic oxide particles and PAA on the transparent substrate 111, drying the coating, and imidizing by heat treating. Thus, the nanocomposite layer may be formed on the transparent substrate 111. In this regard, the coating may be performed using any suitable method, such as spin-coating, doctor blading, applicator-coating, casting, dipping, and spray-coating.

Transparent Conductive Layer 120

The transparent conductive layer (transparent electrode) 120 is a layer that functions as a positive electrode of the surface emitting device 100, has sufficient electrical conductivity, and comprises a transparent material so as to emit light to the outside of the surface emitting device 100. Particularly, the material used to form the transparent conductive layer 120 may be a transparent oxide semiconductor, for example at least one selected from an indium tin oxide (ITO), an indium zinc oxide (IZO) (e.g., InZnO), ZnO, and $In_2O_3$, so long as the transparent oxide semiconductor has a suitably high work function.

Organic EL Layer 130

The organic electroluminescent (EL) layer 130 includes at least an hole transport layer (HTL) and an emission layer (EML). The organic EL layer 130 may also include a hole injection layer (HIL). If the organic EL layer 130 includes both of the HTL and the HIL, the HIL may be disposed closer to the transparent conductive layer 120 than the HTL. In addition, the EML may be disposed farther from the transparent conductive layer 120 than the HTL.

A hole transporting material used to form the HTL may be any suitable HTL material such as at least one selected from N,N'-bis(1-naphthyl)-N,N'-diphenyl-1,1'-biphenyl-4,4'-diamine (α-NPD or NPB), N,N'-diphenyl-N,N'-bis-(3-methylphenylene)-1,1'-diphenyl-4,4'-diamine (TPD), tetra-acetalporphyrin (TACP), and triphenyl tetramer. A hole injecting material used to form the HIL may be any suitable HIL material such as at least one selected from polyaniline, polypyrrole, copper phthalocyanine (CuPC), and Poly(3,4-ethylenedioxythiophene)poly(styrenesulfonate) PEDOT:PSS.

The organic EML may include at least one layer selected from a red EML, a green EML, and a blue EML.

A material used to form the red EML may be, for example, at least one selected from tetraphenylnaphthacene (Rubrene), tris(1-phenylisoquinoline)iridium(III) (Ir(pi q)$_3$), bis(2-benzo[B]thiophene-2-yl-pyridine)(acetylacetonate)iridium (III) (Ir(btp)$_2$(acac)), tris(dibenzoylmethane)phananthrolineeuropium(III) (Eu(dbm)$_3$(phen)), tris[4,4'-di-tert-butyl-(2,2')-bipyridine]ruthenium(III) complex (Ru(dtb-bpy)$_3$*2 (PF$_6$)), DCM1, DCM2, Eu(thenoyltrifluoroacetone)$_3$ (Eu (TTA)$_3$, and butyl-6-(1,1,7,7-tetramethyljulolidyl-9-enyl)-4H-pyran) (DCJTB), and may also be a polymeric emitting material such as a polyfluorene-based polymer and a polyvinyl-based polymer.

In addition, a material used to form the green EML may be, for example, at least one selected from Alq$_3$, 3-(2-benzothiazolyl)-7-(diethylamino)cumarin (Coumarin6), 2,3,6,7-tetrahydro-1,1,7,7,-tetramethyl-1H,5H,11H-10-(2-benzothiazolyl)quinolidine-[9,9A,1gh]cumarin (C545T), N,N'-dimethyl-quinacridone (DMQA), and tris(2-phenylpyridin) iridium(III) (Ir(ppy)$_3$), and may also be a polymeric emitting material such as a polyfluorene-based polymer and a polyvinyl-based polymer.

In addition, a material used to form the blue EML may be, for example, an oxadiazole dimer dye (BIS-DAPDXP), a spiro compound (Spiro-DPVBi and SPIRO-6P), a triarylamine compound, bis(styryl)amine (DPVBi, DSA), 4,4'-bis (9-ethyl-3-carbazovinylene)-1,1'-biphenyl (BCzVBi), perylene, 2,5,8,11-tetra-tert-butyl perylene (TPBE), 9H-carbazole-3,3'-(1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl] stilbene (DPAVB), 4,4'-bis[4-(diphenylamino)styryl]biphenyl(BDAVBi), and bis(3,5-difluoro-2-(2-pyridyl)phenyl-(2-carboxypyridyl)iridium III (FIrPic), and may also be a polymeric emitting material such as a polyfluorene-based polymer and a polyvinyl-based polymer.

The organic EL layer 130 may also include an electron transport layer (ETL) or an electron injection layer (EIL) sequentially disposed from the negative electrode 140 rather than the EML. An electron transporting material used to form the ETL may be any suitable ETL material such as at least one selected from an oxazole derivative such as PBD and OXO-7, a triazole derivative, a boron derivative, a sirole derivative, and Alq$_3$. In addition, an electron injecting material may be any suitable electron injecting material such as at least one selected from LiF, Li$_2$O, CaO, CsO, and CsF$_2$.

Negative Electrode 140

A material used to form the negative electrode 140 may comprise a metal, particularly, a metal having a low work function, such as at least one selected from Ag, Mg, Al, Pt, Pd, Au, Ni, Nd, Ir, Cr, Li, Ca, an alloy thereof, and a compound thereof.

4. Method of Preparing Surface Emitting Device

The structure of the surface emitting device 100 is further disclosed above. Hereinafter, an embodiment of a method of preparing the surface emitting device 100 will be disclosed in further detail.

First, an uneven surface is formed on the surface of the transparent substrate 111, which may comprise a soda line glass or alkali-free glass, by sand blasting, or the like, and then a mixture of the surface-modified inorganic oxide particles and PAA is disposed (e.g., coated on) the uneven surface by doctor blading, or the like. Then, the transparent substrate 111 coated with the mixture is dried with a hot-air dryer to remove the solvent. Then, the transparent substrate 111, from which the solvent is removed, is transferred to a calcining furnace to perform imidization at 250° C. or higher. Accordingly, a light-transmissive substrate 110 including the transparent substrate 111 and the coating layer 113 disposed on the transparent substrate 111, wherein the coating layer 113 comprises the nanocomposite in which the surface-modified inorganic oxide particles are dispersed in polyimide, is formed.

Then, a layer of ITO, IZO (InZnO), ZnO, In$_2$O$_3$, or the like, is formed on the light-transmissive substrate 110 by sputtering or the like to form the transparent conductive layer (transparent electrode) 120. Then, an organic EL layer 130 is formed on the transparent conductive layer 120 by disposing (e.g., depositing) a hole transport material or an emitting material, and metal such as Ag, Mg, and Al is deposited on the organic EL layer 130 to form a negative electrode 140. Thus, a surface emitting device 100 including the organic EL layer 130 may be prepared. In addition, the organic EL layer 130 or the negative electrode 140 may be formed by using any suitable method, such as vacuum deposition, casting (spin-casting and dipping), inkjet printing, and printing (letterpress printing, gravure printing, offset printing, and screen printing).

The surface emitting device 100 prepared as described above has excellent emission efficiency by forming the transparent nanocomposite layer having high refractive index on the light-transmissive substrate 110. Thus, the surface emitting device 100 may be efficiently applied to a display device or a lighting device.

EXAMPLES

Hereinafter, an embodiment will be described in further detail with reference to the following examples. However, these examples shall not be limiting.

Synthesis Example 1

First, a method of synthesizing barium titanate (BT) modified with an imide group, as the surface-modified inorganic oxide particles, will be disclosed.

First, a reactor was prepared in a glove box, 2.64 grams (g) of barium metal (Nakarai Techs Co., Ltd.) was dissolved in 111.66 g of 2-methoxyethanol (Wako Pure Chemical Industries Ltd.). After the barium metal was completely dissolved, 4.64 g of titanium tetraethoxide (Tokyo Chemical Industry Co., Ltd.) was added thereto, and the reactor was covered with a lid and carried out of the glove box.

Then, a cooler, a thermometer, and a nitrogen gas inlet were installed to the reactor, and the mixture was refluxed for 2 hours in a nitrogen atmosphere to prepare a BT complex.

The BT complex was heated to 70° C., a mixture of 45.2 g of 2-methoxyethanol and 64.8 g of water maintained at 70° C. was added thereto at a single treatment, and the reactor was covered with a lid, and stirred at 70° C. for 5 hours to form BT particles. The product was treated with ultrasonic waves for 30 minutes to prepare a slurry of BT particles. An average particle diameter of the obtained BT measured using a dynamic light scattering spectrometer (DLS, Otsuka Electronics Co., Ltd.) was 186 nm.

0.8 g of aminopropyltriethoxysilane (APTES, Shin-Etsu Chemical Co., Ltd.) (1.3 times of a stoichiometric amount calculated based on a particle diameter and a minimum coating area) was added to the obtained BT slurry, and the reactor was covered with a lid and stirred at 70° C. for 1 hour to modify the surface of BT with an amino group. Then, the reactor was cooled to room temperature, and solids were isolated by centrifugation. 20 milliliters (mL) of N-methyl-2-pyrrolidone (NMP) was added to the solids and the solids were disintegrated using an ultrasonic cleaning device. The centrifugation and cleaning with the ultrasonic cleaning device was repeated twice to obtain a slurry of BT surface-modified with the amino group and NMP (BT-APTES). An average particle diameter of the slurry was 20 nanometers (nm) (by direct observation) and 59 nm (by a dynamic light scattering spectrometer).

Then, 2.12 g of phthalic anhydride (Wako Pure Chemical Industries Ltd.) and 0.85 g of pyridine were added to the slurry, and the mixture was stirred for 15 hours in a nitrogen atmosphere to perform imidization of the amino group. Solids were isolated by centrifugation, and NMP was added to the solids such that the solids content was 15%, and then the solids were disintegrated by ultrasonic cleaning to obtain a slurry of imide group-containing barium titanate (BT-Imd) in NMP. An average particle diameter of the slurry was 20 nm (by direct observation) and 41 nm (by a dynamic light scattering spectrometer).

Synthesis Example 2

A slurry of imide group-modified barium titanate (BT-NPEPI), comprising a phosphoric acid ester group between the imide group and the barium titanate, and NMP was prepared in the same manner as in Synthesis Example 1, except that O-phosphorylethanolamine was used as the surface coating agent instead of aminopropyltriethoxysilane. An average particle diameter of the slurry measured was 21 nm by direct observation and 68 nm by a dynamic light scattering spectrometer.

Synthesis Example 3

Hereinafter, a method of synthesizing titanium oxide modified with an imide group as the surface-modified inorganic oxide particles will be described.

50 g of a methyl ethyl ketone (MEK) solution of titanium oxide (with an average particle diameter of 7 nm) having the unmodified surface (Sakai Chemical Industry Co., Ltd., (solids content: 15%) and 2.8 g of APTES were added to a reactor equipped with a cooler, a thermometer, and a nitrogen gas inlet, and the reactor was stirred at 70° C. for 1 hour to obtain a solution of titanium oxide surface-modified with an amino group. Then, the process used in Synthesis Example 1 was used to obtain a slurry of imide group-containing titanium oxide ($TiO_2$-Imd(1)) and NMP having a solids content of 15%. An average particle diameter of the slurry was 7 nm (by direct observation) and 51 nm (by a dynamic light scattering spectrometer).

Synthesis Example 4

A slurry of imide group-containing titanium oxide ($TiO_2$-Imd(1)) and NMP having a solids content of 15% was prepared in the same manner as in Synthesis Example 3, except that titanium oxide (Teika Co., Ltd., MT-700B) having an average particle diameter of 80 nm was used as the titanium oxide. An average particle diameter of the slurry was 80 nm (by direct observation) and 186 nm (by a dynamic light scattering spectrometer).

Synthesis Example 5

A slurry of imide group-containing zirconium oxide ($ZrO_2$-Imd) and NMP having a solids content of 15% was prepared in the same manner as in Synthesis Example 2, except that 50 g of a solution of zirconium oxide and MEK ((Sakai Chemical Industry Co., Ltd.) was used instead of titanium oxide and 7.99 g of APTES was used. An average particle diameter of the slurry was 3 nm (by direct observation) and 20 nm (by a dynamic light scattering spectrometer).

Synthesis Example 6

50 g of a methyl ethyl ketone (MEK) solution of titanium oxide (Sakai Chemical Industry Co., Ltd., solids content: 15%) was centrifuged to isolate solids, 50 mL of NMP was added to the solids, and the solids were disintegrated using an ultrasonic cleaning device to obtain a slurry of titanium oxide particles ($TiO_2$) and NMP having a solids content of 15%. An average particle diameter of the slurry was 7 nm (by direct observation) and 85 nm (by a dynamic light scattering spectrometer).

Synthesis Example 7

A reactor was prepared in a glove box, 2.64 g of barium metal (Nakarai Techs Co., Ltd.) was dissolved in 111.66 g of 2-methoxyethanol (Wako Pure Chemical Industries Ltd.). After the barium metal was completely dissolved, 4.64 g of titanium tetraethoxide (Tokyo Chemical Industry Co., Ltd.) was added thereto, and the reactor was covered with a lid and carried out of the glove box.

Then, a cooler, a thermometer, and a nitrogen gas inlet were installed to the reactor, and the mixture was refluxed for 2 hours in a nitrogen atmosphere to prepare a BT complex.

The BT complex was heated to 70° C., a mixture of 45.2 g of 2-methoxyethanol and 64.8 g of water maintained at 70° C. was added thereto at a single treatment, and the reactor was covered with a lid, and stirred at 70° C. for 5 hours to form BT particles. The product was treated with ultrasonic waves for 30 minutes to prepare a slurry of BT particles.

The obtained slurry of BT particles was centrifuged to isolate solids, and the solids were disintegrated by adding NMP using an ultrasonic cleaning device. The centrifugation and cleaning with the ultrasonic cleaning device was repeated twice to obtain a slurry of NMP-substituted BT particles.

PAA having triethoxysilane at both ends thereof represented by Formula 7 below was added to the slurry, and the mixture was stirred at 70° C. for 1 hour and treated with ultrasonic waves for 30 minutes to obtain BT particles having a surface modified with the PAA. An average particle diameter of the slurry was 23 nm (by direct observation) and 1000 nm (by a dynamic light scattering spectrometer). The average particle diameter shows that if the surface of the nanoparticles is directly treated with a polymeric compound such as PAA, the particles aggregate to form large secondary particles, although the particle diameter of the primary particles does not increase.

Formula 7

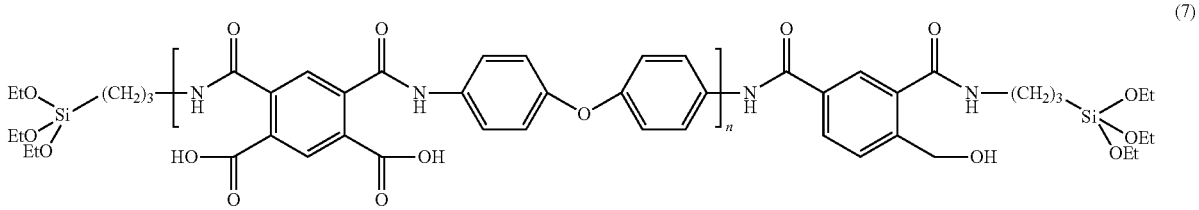

(7)

Particle diameters of particles prepared in Synthesis Examples 1 to 7 are shown in Table 1 below.

TABLE 1

| Compound | | Particle diameter (nm) Direct observation | Particle diameter (nm) Dynamic light scattering spectrometer |
|---|---|---|---|
| Synthesis Example 1 | BT-APTES | 20 | 59 |
| Synthesis Example 1 | BT-Imd | 20 | 41 |
| Synthesis Example 2 | BT-NPEPI | 21 | 68 |
| Synthesis Example 3 | $TiO_2$-Imd(1) | 7 | 51 |
| Synthesis Example 4 | $TiO_2$-Imd(2) | 80 | 186 |
| Synthesis Example 5 | $ZrO_2$-Imd | 3 | 20 |
| Synthesis Example 6 | $TiO_2$ | 7 | 85 |
| Synthesis Example 7 | BT-SiPAA | 20 | 1000 |

Synthesis Example 8

Hereinafter a method of synthesizing PAA will be described.

7.08 g of bis(3-aminophenyl)sulfone was completely dissolved in 65.12 g of NMP in a reactor equipped with a nitrogen gas inlet at room temperature. Then, 8.83 g of 3,4,3',4'-biphenyltetracarboxylic acid was added thereto, and the mixture was stirred at room temperature in a nitrogen atmosphere for 15 hours to obtain a solution of PAA and NMP (hereinafter PAA-1) having a solids content of 20%.

Synthesis Example 9

Hereinafter, an in-situ synthesis of a nanocomposite will be described. 77.6 g of BT-NPEPI (solids content: 15%) synthesized in Synthesis Example 2 was added to a reactor equipped with a nitrogen gas inlet. Then, 2.05 g of bis(3-aminophenyl)sulfone was added thereto to completely dissolve the BT-NPEPI. Then, 2.43 g of 3,4,3',4'-biphenyltetracarboxylic acid was added thereto, and the mixture was stirred at room temperature in a nitrogen atmosphere for 15 hours to synthesize PAA in the BT-NPEPI-containing NMP solution. Thus, a BT nanocomposite was synthesized by the in-situ method.

Example 1

3.67 g of BT-Imd (solids content: 15%) synthesized in Synthesis Example 1 and 6.34 g of PAA-1 (solid content: 20%) synthesized in Synthesis Example 8 were mixed using a bubble removing-stirrer (Thinky Co., Ltd.) for 5 minutes, and treated with ultrasonic waves to prepare a mixture. The mixture was coated on a glass substrate by spin coating. Then, the product was treated with a hot plate at 100° C. for 1 hour and heat-treated in an oven in a nitrogen gas atmosphere at 100° C. for 30 minutes, at 150° C. for 30 minutes, at 250° C. for 30 minutes, and at 300° C. for 1 hour to prepare a nanocomposite layer having a BT-Imd filling rate of 12% by volume. A thickness measured using a sensing pin type film thickness measuring device (Albek Co. Ltd., DEKTAK) was 2.9 micrometers (μm). The layer had a refractive index of 1.73, a haze of 1.3%, and a transmissivity of 85% at 550 nm.

Examples 2 to 7

Nanocomposite layers were prepared by changing the type of oxide particles and the amounts of PAA as shown in Table 2 below in Examples 2 to 7.

Example 8

A BT nanocomposite layer was prepared in the same manner as in Example 1 using the nanocomposite solution prepared by in-situ synthesis in Synthesis Example 8.

Comparative Example 1

1.57 g of intermediate amino group-modified BT particles (BT-APTES, solid content: 15%) synthesized in Synthesis Example 1 and 4.37 g of PAA-1 (solid content: 20%) synthesized in Synthesis Example 8 were mixed using a bubble removing-stirrer (Thinky Co., Ltd.) for 5 minutes, and treated with ultrasonic waves for 3 hours to prepare a mixture solution. The mixture solution was coated on a glass substrate by spin coating. Then, the product was treated with a hot plate at 100° C. for 1 hour and heat-treated in an oven in a nitrogen gas atmosphere at 100° C. for 30 minutes, at 150° C. for 30 minutes, at 250° C. for 30 minutes, and at 300° C. for 1 hour to prepare a nanocomposite layer having a BT-APTES filling rate of 45% by volume. A thickness measured using a sensing pin type film thickness measuring device (Albek Co. Ltd., DEKTAK) was 1.2 μm. The layer had a refractive index of 1.84, a haze of 16.8%, and a transmissivity of 70% at 550 nm.

Comparative Examples 2 to 5

In Comparative Examples 2 and 3, nanocomposite layers were prepared in the same manner as in Comparative Example 1, except that the type of particles was changed. In Comparative Example 4, a nanocomposite layer was prepared in the same manner as in Comparative Example 1, except that polymethyl methacrylate (PMMA) was used instead of PAA. In Comparative Example 5, the PAA was cured, and characteristics of the nanocomposite layers prepared in Comparative Examples 2 to 5 were evaluated.

Evaluation

Refractive index was measured using a Model 2010 prism coupler (Metricon Co.) and an M-2000U spectroscopic ellipsometer (J.A. Woollam Co.).

Thermogravimetric analysis was performed by using a thermogravimetric-differential thermal analysis (TG/DTA) device (Seiko, SSC5200 TA station T G/DTA220) and 5% weight loss temperature.

The haze value was measured using a Hazemeter Haze guide II (Toyo Seiki Co., Ltd.).

Light transmissivity was measured using a UV/VIS spectrometer (UV/VIS; Hitachi, UV-3010).

Light was reflected while passing through an interface between two layers having different refractive indexes, decreasing light transmissivity. The degree of decrease in the light transmissivity is determined according to the refractive index of a material. Also, a correction was performed during the measuring. The decrease ratio is calculated by Equation 1 when the resin is measured alone with reference to air and by Equation 2 when the resin is measured on the glass substrate.

$$\text{transmissivity} (\%) = \left\{ \left( 1 - \frac{(n_1 - 1.0)^2}{(n_1 + 1.0)^2} - \frac{(n_1 - 1.0)^2}{(n_1 + 1.0)^2} \right) \times F \right\} \times 100 \quad \text{Equation 1}$$

$$\text{transmissivity} (\%) = \left\{ \left( 1 - \frac{(n_g - 1.0)^2}{(n_g + 1.0)^2} - \frac{(n_1 - n_g)^2}{(n_1 + n_g)^2} - \frac{(n_1 - 1.0)^2}{(n_1 + 1.0)^2} \right) \times F \right\} \times 100 \quad \text{Equation 2}$$

In Equations 1 and 2, $n_1$ is refractive index of the nanocomposite, $n_g$ is refractive index of glass, and F is a factor indicating a decrease rate of light while passing through the resin.

Referring to Equations 1 and 2, as the refractive index increases, transmissivity decreases to increase the refractive index difference in the interface. Thus, in order to increase transmissivity, the nanocomposite desirably has high transparency.

Results from the evaluation of Examples 1 to 8 and Comparative Examples 1 to 5 are shown in Table 2 below.

TABLE 2

| | Example 1 | Example 2 | Example 3 | Example 4 | Example 5 | Example 6 | Example 7 | Example 8 | Comparative Example 1 | Comparative Example 2 | Comparative Example 3 | Comparative Example 4 | Comparative Example 5 |
|---|---|---|---|---|---|---|---|---|---|---|---|---|---|
| Production method | Directly mixing | | | | | | | In situ synthesis | Directly mixing | | | | |
| BT-Imd | 5.50 | 7.72 | 10.00 | 11.64 | | | | | | | | 12.01 | |
| $TiO_2$-Imd(1) | | | | | 11.32 | | | | | | | | |
| $TiO_2$-Imd(2) | | | | | | 11.32 | | | | | | | |
| $ZrO_2$-Imd | | | | | | | 13.21 | | | | | | |
| BT-NPEPI | | | | | | | | 11.64 | | | | | |
| BT-APTES | | | | | | | | | 11.81 | | | | |
| $TiO_2$ | | | | | | | | | | 11.50 | | | |
| BT-SiPAA | | | | | | | | | | | 16.21 | | |
| PAA-1 | 12.67 | 9.71 | 6.68 | 4.48 | 4.54 | 4.54 | 3.67 | 4.48 | 4.37 | 4.49 | 3.85 | | 20.00 |
| PMMA | | | | | | | | | | | | 4.05 | |
| NMP | 81.83 | 82.57 | 83.32 | 83.88 | 84.14 | 84.14 | 83.12 | 83.88 | 83.82 | 84.01 | 79.94 | 83.94 | 80.00 |
| Total | 100.00 | 100.00 | 100.00 | 100.00 | 100.00 | 100.00 | 100.00 | 100.00 | 100.00 | 100.00 | 100.00 | 100.00 | 100.00 |
| Particle-containing ratio (vol %) | 12 | 20 | 32 | 45 | 45 | 45 | 45 | 45 | 45 | 45 | 45 | 45 | 0 |
| Transmissivity (@ 550 nm) | 85 | 83 | 83 | 81 | 80 | 78 | 87 | 80 | 70 | 64 | 58 | 75 | 87 |
| Total light transmissity | 87.6 | 87.1 | 86.2 | 84.7 | 85.1 | 83.2 | 87.3 | 84.2 | 80.2 | 76.9 | 80.3 | 85.8 | 88.6 |
| Haze | 1.3 | 1.8 | 2.1 | 2.3 | 2.0 | 8.9 | 2.8 | 2.5 | 16.8 | 64.1 | 69.7 | 2.3 | 0.2 |
| Refractive index | 1.73 | 1.76 | 1.78 | 1.83 | 1.99 | 2.05 | 1.75 | 1.83 | 1.84 | * | * | 1.78 | 1.69 |
| 5% weight loss (° C.) | 496 | 498 | 515 | 475 | 481 | 486 | 484 | 477 | 461 | 484 | 486 | 320 | 498 |

* not detected because of a rough surface

Referring to Table 2, the nanocomposite layers prepared in Examples 1 to 8 had high transparency, high refractive index, and excellent heat resistance.

Organic EL Device

An organic EL device was prepared by using a light-transmissive substrate prepared by using the nanocomposite. Particularly, the organic EL device was evaluated as follows.

800 powdered alumina was ejected onto a 50 mm×50 mm soda lime glass having a thickness of 0.7 mm at 0.5 kiloPascals (kPa) to prepare a substrate having an uneven surface. The uneven surface of the substrate was observed by using a Laser microscope (Keyence, VK 9510, Ra=0.7 μm). The substrate had a light transmissivity of 82% and a Haze value of 91% which was measured using a Hazemeter Haze guide II (Toyo Seiki Co., Ltd.), and it was identified that a light scattering layer was formed.

The nanocomposite material prepared in Example 4 was coated on a substrate having an uneven surface and a substrate that does not have an uneven surface (soda lime glass substrate that is not processed by sand blasting) by doctor blading, and the substrates were treated with a hot plate at 100° C. for 1 hour and heat-treated in an oven in a nitrogen atmosphere at 100° C. for 30 minutes, at 150° C. for 30 minutes, at 250° C. for 30 minutes, at 300° C. for 1 hour to form a layer.

A thickness of the composite layer formed on the substrate not having an uneven surface measured using a sensing pin type film thickness measuring device (Albek Co. Ltd., DEKTAK) was 15 μm. In addition, Ra of the substrate coated with the nanocomposite was 30 nm or less, and it was identified that a flat composite layer was formed. The substrate not having an uneven surface and coated with a composite layer having high refractive index had a total light transmissivity of 83% and a Haze value of 8%.

The substrate having an uneven surface and coated with a composite layer had a total light transmissivity of 75%, a Haze value of 90%, and a surface profile Ra of 30 nm or less. As such, a light-transmissive substrate having an inner scattering layer and a flat surface was prepared. Then, 120 nm of ITO was formed on soda lime glass and three types of glass substrates were prepared as described above using a DC magnetron sputtering device. A substrate having an uneven surface and coated with a composite layer was substrate A of Example 9, a substrate not having an uneven surface and coated with a composite layer was substrate B of Comparative Example 6, and a substrate formed using soda lime glass was substrate C of Comparative Example 7, as shown in Table 3.

Then, an organic EL device was prepared using a substrate prepared using the nanocomposite. ITO added-substrates A to C were cleaned using IPA and pure water and treated with a UV ozone cleaner. A hole injection layer (Hole Injection Layer-1, "HIL-1") was vacuum deposited to a thickness of 60 nm to form an hole injection layer (HIL), NPD was vacuum deposited to a thickness of 20 nm to form an HTL, and Alq3 was vacuum deposited to a thickness of 60 nm to form a green EML. LiF was deposited to a thickness of 3 nm to form an EIL, and Al was deposited to a thickness of 200 nm to form a negative electrode to prepare an organic EL device. The organic EL device was placed in a glove box in a dry nitrogen atmosphere without being exposed to the air. The organic EL was encapsulated using an encapsulating plate including an absorbent containing powdered barium oxide and a UV curing resin sealing agent by curing the sealing agent by UV rays.

Figure 6:
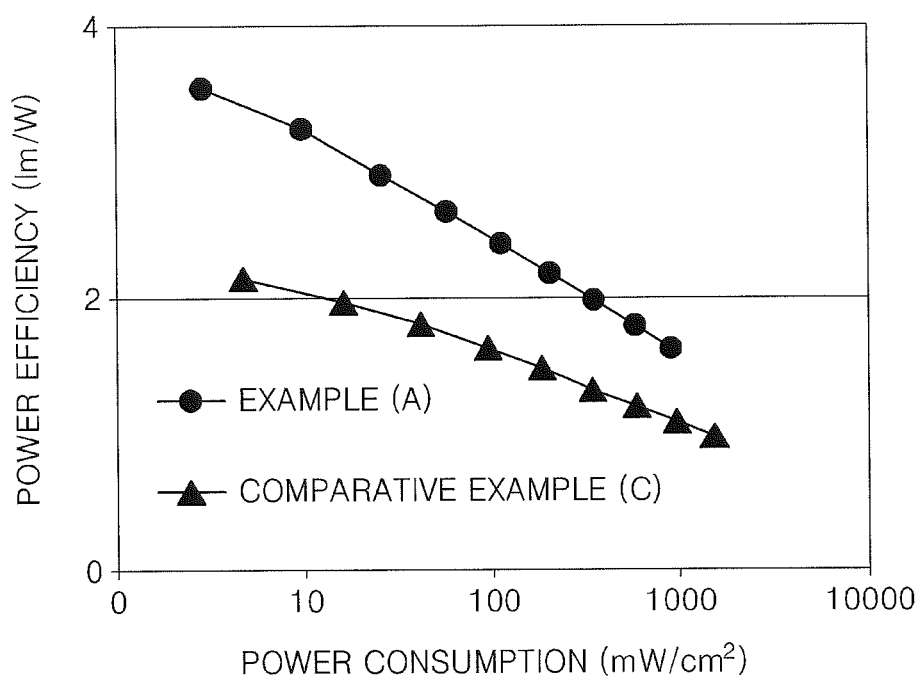
FIG. 6 is a graph illustrating current-voltage characteristics in Example 9 and in Comparative Example 7.

Current-voltage-total luminous flux characteristics were measured by using a measuring device including a source meter 2400, an integrating sphere, and an illuminometer (KEITHLEY). Current-voltage characteristics were the same in all devices. The results are shown in Table 3 and FIG. 6. Upon comparing power consumption using the light-transmissive substrate, the organic EL device of Example 9 had an emission efficiency about 1.6 times greater than that of Comparative Examples 7.

TABLE 3

| | Substrate | Structure | Power efficiency lm/W @100 mW/cm² |
|---|---|---|---|
| Example 9 | (A) | substrate/nanocomposite/ITO/organic EL | 2.58 |
| Comparative Example 6 | (B) | flat substrate/nanocomposite/ITO/organic EL | 1.55 |
| Comparative Example 7 | (C) | flat substrate/ITO/organic EL | 1.61 |

As described above, according to the disclosed embodiment, inorganic particles that have high cohesion and high refractive index may be uniformly dispersed in a polyimide that has a strong intermolecular binding force by modifying the surface of the inorganic oxide particles with an imide functional group, and thus, a nanocomposite having high heat resistance, excellent transparency, and high refractive index may be prepared. In addition, a surface emitting device having excellent emission efficiency may be prepared by using the nanocomposite.

It should be understood that the exemplary embodiment described herein should be considered in a descriptive sense only and not for purposes of limitation. Descriptions of features, advantages or aspects within each embodiment should be considered as available for other similar features, advantages, or aspects in other embodiments.

What is claimed is:

1. A nanocomposite comprising:
a matrix comprising a polyimide; and
surface-modified inorganic oxide particles dispersed in the matrix, wherein a surface of the surface-modified inorganic oxide particles is modified with a functional group having an imide backbone,
wherein the functional group having an imide backbone comprises at least one selected from the groups represented by Formulas 1a, 1b, and 1 d:

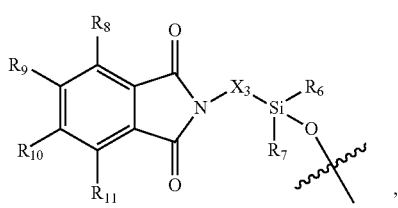

Formula 1a

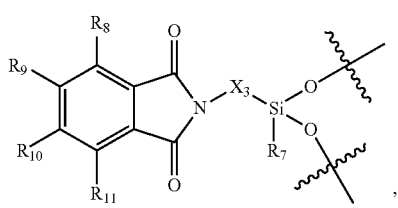

Formula 1b

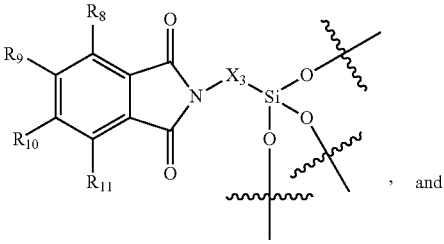

Formula 1c

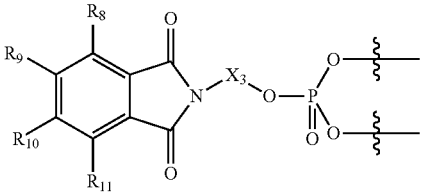

Formula 1d wherein each $X_3$ is independently selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group, each $R_6$ and $R_7$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, a substituted or unsubstituted $C_4$-$C_{30}$ heteroaryl group, and a substituted or unsubstituted $C_1$-$C_{20}$ alkoxy group, and each $R_8$, $R_9$, $R_{10}$ and $R_{11}$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, and a substituted or unsubstituted $C_4$-$C_{30}$ heteroaryl group.

2. The nanocomposite of claim 1, wherein
$X_3$ is an unsubstituted $C_1$-$C_{20}$ alkylene group, and
$R_6$, $R_7$, $R_8$, $R_9$, $R_{10}$, and $R_{11}$ are each independently a hydrogen atom or an unsubstituted $C_1$-$C_{20}$ alkyl group.

3. The nanocomposite of claim 2, wherein $X_3$ is propylene, and
$R_6$, $R_7$, $R_8$, $R_9$, $R_{10}$, and $R_{11}$ are each hydrogen.

4. The nanocomposite of claim 1, wherein a refractive index of the nanocomposite is 1.7 or greater.

5. The nanocomposite of claim 1, wherein a haze value of the nanocomposite is 10% or less.

6. The nanocomposite of claim 1, wherein a 5% weight loss temperature of the nanocomposite, when measured by thermogravimetric differential thermal analysis, is 450° C. or higher.

7. The nanocomposite of claim 1, wherein the inorganic oxide particles comprise at least one inorganic oxide selected from titanium oxide, zirconium oxide, and barium titanate.

8. The nanocomposite of claim 1, wherein the inorganic oxide particles comprise barium titanate.

9. The nanocomposite of claim 1, wherein an average particle diameter of the inorganic oxide particles is 2 nanometers to 100 nanometers.

10. A method of preparing a nanocomposite, the method comprising:
  providing surface-modified inorganic oxide particles having a surface modified with a functional group having an imide backbone;
  contacting the surface-modified inorganic oxide particles with a poly(amic acid) to form a mixture; and
  heat-treating the mixture to form a polyimide and prepare the nanocomposite,
  wherein the functional group having an imide backbone comprises at least one selected from the groups represented by Formulas 1a, 1b, and 1 d:

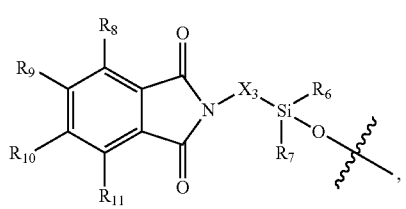

Formula 1a

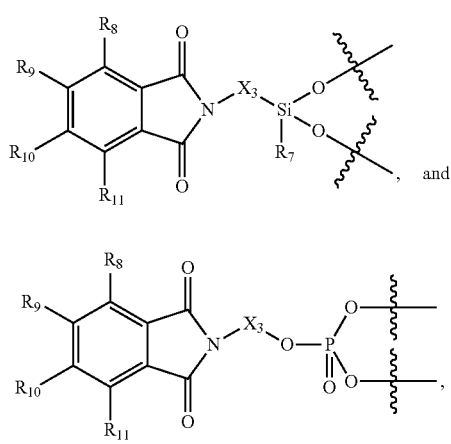

Formula 1b

, and

Formula 1d

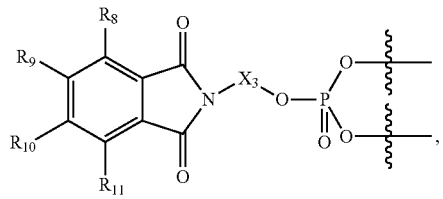

, wherein each $X_3$ is independently selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group, each $R_6$ and $R_7$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, a substituted or unsubstituted $C_4$-$C_{30}$ heteroaryl group, and a substituted or unsubstituted $C_1$-$C_{20}$ alkoxy group, and each $R_8$, $R_9$, $R_{10}$ and $R_{11}$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, and a substituted or unsubstituted $C_4$-$C_{30}$ heteroaryl group.

11. The method of claim 10, wherein the providing the surface-modified inorganic oxide particles comprises contacting a surface of inorganic oxide particles with an amino group-containing silane coupling agent represented by Formula 1:

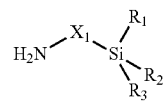

Formula 1 wherein $X_1$ is selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group, and $R_1$, $R_2$, and $R_3$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, a substituted or unsubstituted $C_4$-$C_{30}$ heteroaryl group, and a substituted or unsubstituted $C_1$-$C_{20}$ alkoxy group, or with an amino group-containing phosphoric acid ester compound represented by Formula 2:

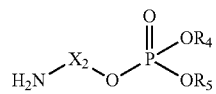

Formula 2 wherein $X_2$ is selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group, and $R_4$ and $R_5$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, and a substituted or unsubstituted $C_4$-$C_{30}$ heteroaryl group to provide amino-functionalized inorganic oxide particles; and at least partially imidizing the amino groups of the amino-functionalized inorganic oxide particles.

12. The method of claim 11, wherein $X_1$ and $X_2$ are propylene.

13. The method of claim 11, wherein the surface-modified inorganic oxide particles comprise at least one inorganic oxide selected from zirconium oxide, yttria doped zirconium oxide, lead zirconate, strontium titanate, tin titanate, tin oxide, bismuth oxide, niobium oxide, tantalum oxide, potassium tantalate, tungsten oxide, cerium oxide, lanthanum oxide, gallium oxide, silica, alumina, titanium oxide, zirconium oxide, and barium titanate.

14. The method of claim 11, wherein the amino-functionalized inorganic oxide particles are at least partially imidized with a phthalic anhydride represented by Formula 8:

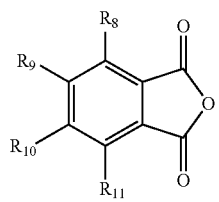

Formula 8 wherein each $R_8$, $R_9$, $R_{10}$ and $R_{11}$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, and a substituted or unsubstituted $C_4$-$C_{30}$ heteroaryl group.

15. A method of preparing a nanocomposite, the method comprising:
providing surface-modified inorganic oxide particles having a surface modified with a functional group having an imide backbone;
contacting the surface-modified inorganic oxide particles with a diamine and an acid dianhydride to prepare a mixture of the surface-modified inorganic oxide particles and a poly(amic acid); and
heat-treating the mixture to form a polyimide and prepare the nanocomposite,
wherein the functional group having an imide backbone comprises at least one selected from the groups represented by Formulas 1a, 1b, and 1 d:

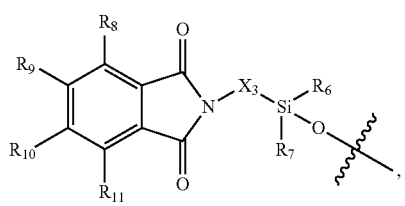

Formula 1a

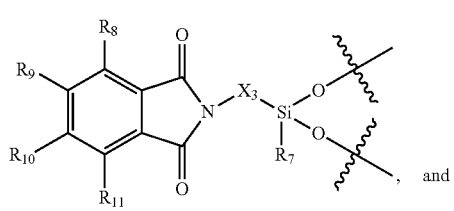

Formula 1b

, and

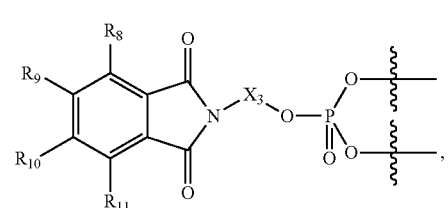

Formula 1d wherein each $X_3$ is independently selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group,
each $R_6$ and $R_7$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, a substituted or unsubstituted $C_4$-$C_{30}$ heteroaryl group, and a substituted or unsubstituted $C_1$-$C_{20}$ alkoxy group, and
each $R_8$, $R_9$, $R_{10}$ and $R_{11}$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, and a substituted or unsubstituted $C_4$-$C_{30}$ heteroaryl group.

16. The method of claim 15, wherein the providing surface-modified inorganic oxide particles comprises contacting an inorganic oxide with an amino group-containing silane coupling agent represented by Formula 1:

Formula 1 wherein $X_1$ is selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group, and
$R_1$, $R_2$, and $R_3$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, a substituted or unsubstituted $C_4$-$C_{30}$ heteroaryl group, and a substituted or unsubstituted $C_1$-$C_{20}$ alkoxy group, or
with an amino group-containing phosphoric acid ester compound represented by Formula 2:

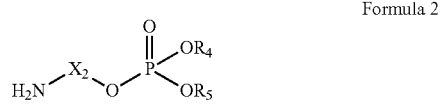

Formula 2 wherein $X_2$ is selected from a substituted or unsubstituted $C_1$-$C_{20}$ alkylene group, a substituted or unsubstituted $C_6$-$C_{30}$ arylene group, a substituted or unsubstituted $C_1$-$C_{20}$ heteroalkylene group, and a substituted or unsubstituted $C_4$-$C_{30}$ heteroarylene group, and
$R_4$ and $R_5$ are each independently selected from a hydrogen atom, a halogen atom, a carboxyl group, a cyano group, a substituted or unsubstituted $C_1$-$C_{20}$ alkyl group, a substituted or unsubstituted $C_1$-$C_{20}$ heteroalkyl group, a substituted or unsubstituted $C_6$-$C_{30}$ aryl group, and a substituted or unsubstituted $C_4$-$C_{30}$ heteroaryl group to provide amino-functionalized inorganic oxide particles; and
at least partially imidizing the amino groups of the amino-functionalized inorganic oxide particles.

17. A surface emitting device comprising:
a light-transmissive substrate comprising a transparent substrate and a coating layer disposed on the transparent substrate, wherein the coating layer comprises a nanocomposite according to claim 1;
a transparent conductive layer disposed on the light-transmissive substrate; and
an organic EL layer disposed on the transparent conductive layer.

* * * * *